(12) United States Patent
Nagasawa

(10) Patent No.: US 9,331,036 B2
(45) Date of Patent: May 3, 2016

(54) SEMICONDUCTOR DEVICE

(71) Applicant: RENESAS ELECTRONICS CORPORATION, Kanagawa (JP)

(72) Inventor: Takaharu Nagasawa, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/688,953

(22) Filed: Apr. 16, 2015

(65) Prior Publication Data

US 2015/0221604 A1    Aug. 6, 2015

Related U.S. Application Data

(63) Continuation of application No. 14/081,585, filed on Nov. 15, 2013, now Pat. No. 9,035,472.

(30) Foreign Application Priority Data

Nov. 16, 2012 (JP) ................................. 2012-252309

(51) Int. Cl.
*H01L 23/053* (2006.01)
*H01L 23/00* (2006.01)
(Continued)

(52) U.S. Cl.
CPC ............ *H01L 24/09* (2013.01); *H01L 23/3677* (2013.01); *H01L 23/49816* (2013.01); *H01L 23/49822* (2013.01); *H01L 23/49838* (2013.01); *H01L 23/49894* (2013.01); *H01L 24/49* (2013.01); *H01L 23/3128* (2013.01); *H01L 24/05* (2013.01); *H01L 24/16* (2013.01);
(Continued)

(58) Field of Classification Search
CPC ................... H01L 23/49811; H01L 23/49816;
H01L 23/49894; H01L 23/49822; H01L 23/3128; H01L 2224/32225; H01L 2224/48227; H01L 2224/73277
USPC ......... 257/690, 693–695, 700, 697, 784, 787, 257/E23.011, E23.015, E23.067, E23.069, 257/E23.116, E23.124
See application file for complete search history.

(56) References Cited

U.S. PATENT DOCUMENTS 7,064,435 B2    6/2006    Chung et al.
7,660,130 B2    2/2010    Fujii
(Continued)

FOREIGN PATENT DOCUMENTS

| JP | 2009-117862 A | 5/2009 |
| JP | 2009-147053 A | 7/2009 |
| JP | 2010-245455 A | 10/2010 |

OTHER PUBLICATIONS

Notice of Allowance issued in U.S. Appl. No. 14/081,585 dated Jan. 22, 2015.

(Continued)

*Primary Examiner* — Jasmine Clark
(74) *Attorney, Agent, or Firm* — McDermott Will & Emery LLP

(57) ABSTRACT

In a semiconductor device, a conductor pattern is disposed in a position overlapped by a semiconductor chip in a thickness direction over the mounting surface (lower surface) of a wiring board. A solder resist film (insulating layer) covering the lower surface of the wiring board has apertures formed such that multiple portions of the conductor pattern are exposed. The conductor pattern has conductor apertures. The outlines of the apertures and the conductor apertures overlap with each other, in a plan view, respectively.

12 Claims, 23 Drawing Sheets

(51) Int. Cl.
  *H01L 23/367* (2006.01)
  *H01L 23/498* (2006.01)
  *H01L 23/31* (2006.01)
  *H05K 1/11* (2006.01)

(52) U.S. Cl.
  CPC ............... *H01L 24/27* (2013.01); *H01L 24/29* (2013.01); *H01L 24/32* (2013.01); *H01L 24/45* (2013.01); *H01L 24/48* (2013.01); *H01L 2224/0401* (2013.01); *H01L 2224/04042* (2013.01); *H01L 2224/05624* (2013.01); *H01L 2224/16225* (2013.01); *H01L 2224/16227* (2013.01); *H01L 2224/2731* (2013.01); *H01L 2224/27334* (2013.01); *H01L 2224/293* (2013.01); *H01L 2224/2929* (2013.01); *H01L 2224/32225* (2013.01); *H01L 2224/45144* (2013.01); *H01L 2224/45147* (2013.01); *H01L 2224/48091* (2013.01); *H01L 2224/48105* (2013.01); *H01L 2224/48227* (2013.01); *H01L 2224/48624* (2013.01); *H01L 2224/48647* (2013.01); *H01L 2224/48824* (2013.01); *H01L 2224/48847* (2013.01); *H01L 2224/4912* (2013.01); *H01L 2224/73265* (2013.01); *H01L 2224/81447* (2013.01); *H01L 2224/8385* (2013.01); *H01L 2224/85447* (2013.01); *H01L 2224/92247* (2013.01); *H01L 2924/15311* (2013.01); *H01L 2924/181* (2013.01); *H01L 2924/351* (2013.01); *H05K 1/114* (2013.01)

(56) References Cited

U.S. PATENT DOCUMENTS 7,687,803 B2     3/2010     Takagi et al.
8,466,565 B2     6/2013     Takeda

OTHER PUBLICATIONS

United States Office Action dated U.S. Appl. No. 14/081,585 dated Sep. 4, 2014.

SEMICONDUCTOR DEVICE

CROSS-REFERENCE TO RELATED APPLICATIONS

The is a Continuation of U.S. patent application Ser. No. 14/081,585, filed on Nov. 15, 2013, now U.S. Pat. No. 9,035,472, which claims priority from Japanese Patent Application No. 2012-252309 filed on Nov. 16, 2012 the entire disclosures of which are incorporated herein by reference.

BACKGROUND

The present invention relates to a technology of a semiconductor device and, for example, to a technology which is effectively applied to a semiconductor device where a conductor pattern having multiple solder balls joined thereto is formed over the mounting surface of a wiring board over which a semiconductor chip is mounted.

Japanese Unexamined Patent Application Publication No. 2009-117862 discloses a semiconductor device including a wiring board in which a solder mask defined (SMD) structure and a non-solder mask defined (NSMD) structure are combined.

Japanese Unexamined Patent Publication No. 2009-147053 discloses a semiconductor device where the positions of apertures formed in a solder resist are shifted toward the corners and peripheries of a wiring board with respect to lands.

Japanese Unexamined Patent Publication No. 2010-245455 discloses a semiconductor device where, of the peripheries of a land (pad) disposed at a corner, a periphery remote from the center of a substrate is covered by a solder resist and a periphery adjacent to the center of the substrate is exposed from the solder resist.

SUMMARY

The inventors of the present application have considered a technology for improving the performance of a semiconductor device. As part of such consideration, the inventors have considered a so-called area array-type semiconductor device, where multiple external terminals are disposed over the mounting surface of a wiring board over which a semiconductor chip is mounted.

If a conductor pattern for heat dissipation formed over the mounting surface of the wiring board and terminals of a mounting substrate are coupled together through a conductive coupling material, such as a solder material, it is possible to improve heat dissipation characteristics of the semiconductor device. However, the inventors have found that simply coupling the conductor pattern for heat dissipation and the terminals of the mounting substrate through the solder material is problematic in terms of the reliability of the semiconductor device.

Other problems and novel features will be apparent from the description of the present specification and the accompanying drawings.

In a semiconductor device according to one aspect of this invention, a conductor pattern is disposed in a position overlapped by a semiconductor chip in a thickness direction over the mounting surface of a wiring board. Multiple apertures are disposed in an insulating layer covering the mounting surface of the wiring board in such a manner that the apertures expose multiple portions of the conductor pattern. Multiple conductor apertures are disposed in the conductor pattern. The outlines of the apertures and the conductor apertures overlap with each other, in a plan view, respectively.

According to the one aspect of this invention, the reliability of the semiconductor device can be improved.

DETAILED DESCRIPTION

Figure 1:
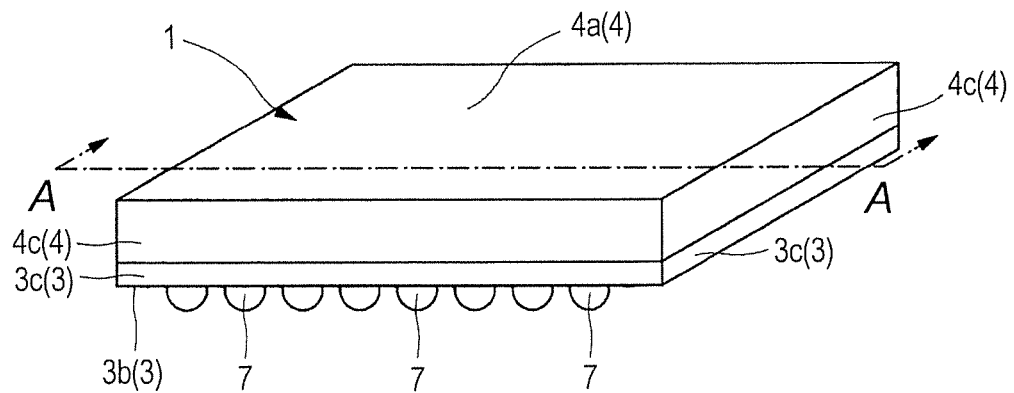
FIG. 1 is a perspective view of a semiconductor device according to an embodiment.

Explanation of Description form, Basic Terms, and Usage of Terms in Present Application In the present application, an embodiment is described as divided into multiple sections or the like for the sake of convenience, as necessary. Unless otherwise specified, the sections or the like are not independent of one another, that is, whether one section is described before or after another section, the sections or the like are components of a single example; one section is part or details of another; one section is a modification of part or all of another; and so on. Similar components will not be described repeatedly in principle. All the elements of the embodiment are not essential unless otherwise specified or except for cases where the number of elements is limited to the number presented and cases where all the elements are clearly essential in terms of the context.

Similarly, if there is a description "X comprised of A" or the like with respect to a material, composition, or the like in the description of a mode or the like, inclusion of a component other than A by X is not excluded unless otherwise specified or except for cases where inclusion of such an element is excluded in terms of the context. For example, in terms of component, "X comprised of A" refers to "X including A as a main component" or the like. For example, "silicon member" or the like is not limited to pure silicon and includes silicon-germanium (SiGe) alloys, other multi-element alloys including silicon as a main component, and members including other additives or the like, as a matter of course. Similarly, gold plating, a Cu layer, nickel plating, or the like is not limited to pure gold plating or the like and includes members having gold, Cu, nickel, or the like as a main component unless other specified.

If a particular number or amount is mentioned, the particular number or amount may be a value exceeding the particular number or a value falling below the particular number unless otherwise specified or except for cases where the number is limited to the particular number theoretically and cases where the number is limited to the particular number in terms of the context.

In the present application, a term "flat surface" or a term "side surface" is used. By using the semiconductor element formation surface of a semiconductor chip as a reference surface, a surface parallel with the reference surface is referred to as a flat surface. A surface perpendicular to the flat surface is referred to as a side surface. Further, a direction linking two separately disposed flat surfaces in a side view is referred to as a thickness direction.

In the present application, a term "upper surface" or term "lower surface" may be used. The mounting mode of a semiconductor package includes various modes. Accordingly, for example, after the semiconductor package is mounted, the upper surface may be disposed below the lower surface. In the present application, the element-formed surface of a semiconductor chip or the chip mounting surface of a wiring board is referred to as an upper surface, and a surface opposite to the upper surface is referred to as a lower surface.

Throughout the drawings of the embodiment, the same or similar components are given the same or similar signs or reference numerals and will not be described repeatedly in principle.

In the accompanying drawings, if hatching or the like makes the drawings complicated or if there is a clear distinction from a gap, hatching or the like may be omitted even in a cross-section. In this regard, if a background outline is apparent from the description or the like, the background outline may be omitted even for a two-dimensionally closed hole. Further, even if the drawing is not a sectional view, hatching or dot pattern may be used in the drawing to clearly show that a certain portion is not a gap or to clearly show the boundary between regions.

Embodiment

Figure 2:
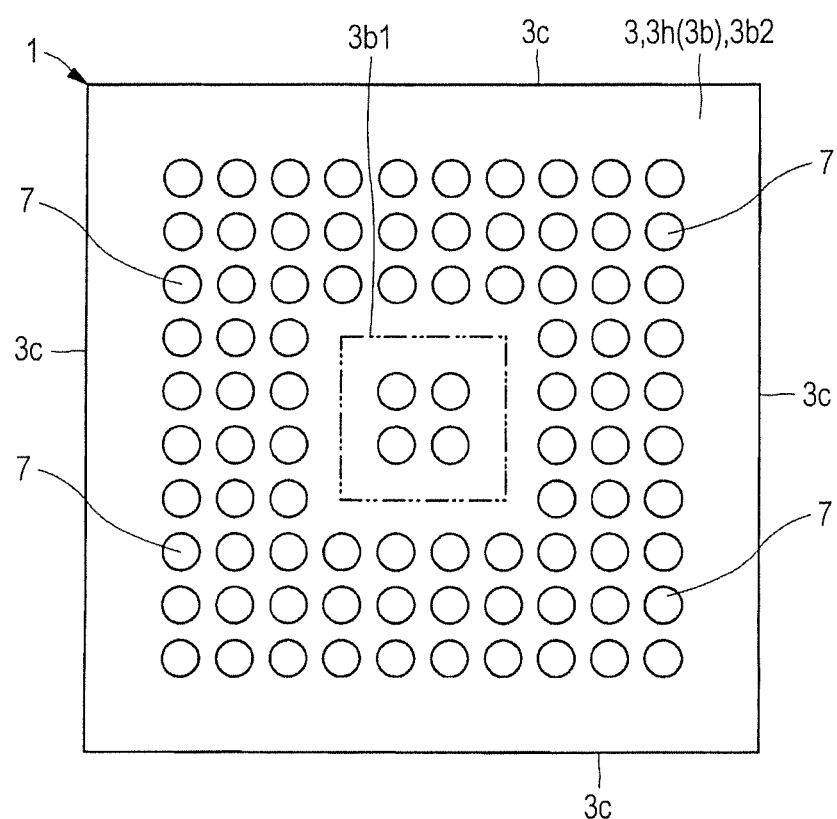
FIG. 2 is a bottom view of the semiconductor device shown in FIG. 1.
Figure 3:
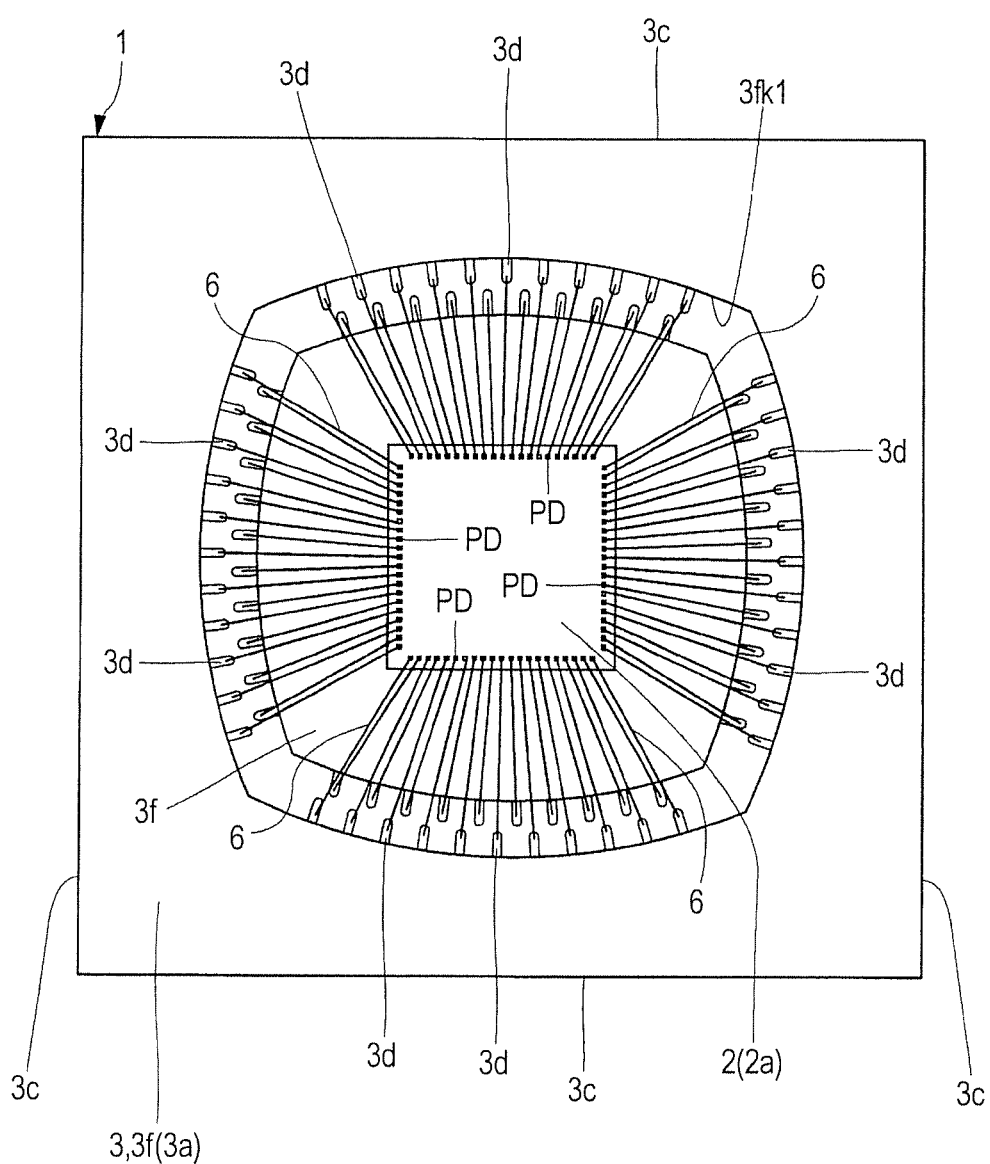
FIG. 3 is a perspective plan view showing the internal structure of the semiconductor device on a wiring board in a state in which a sealing body shown in FIG. 1 is removed.
Figure 4:
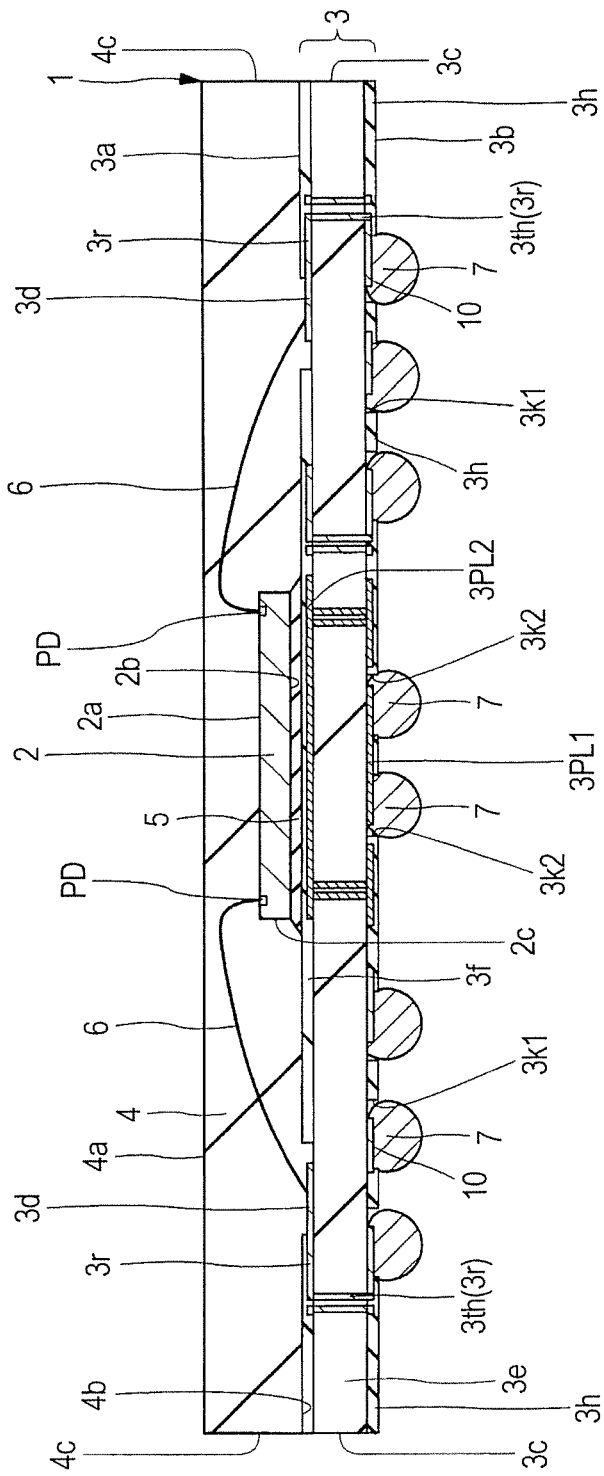
FIG. 4 is a sectional view taken along line A-A of FIG. 1.
Figure 5:
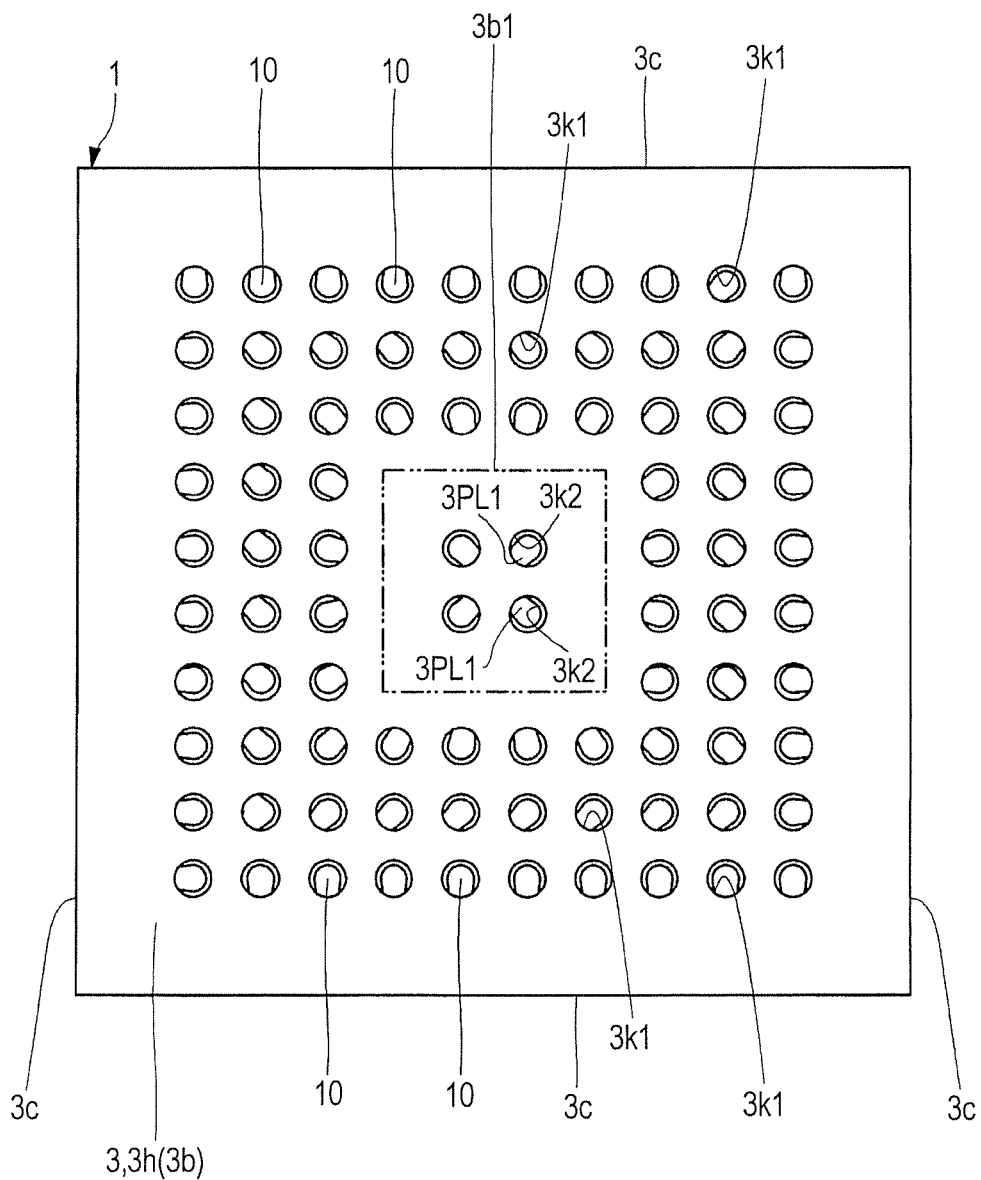
FIG. 5 is a plan view showing a state in which solder balls shown in FIG. 2 are removed.
Figure 6:
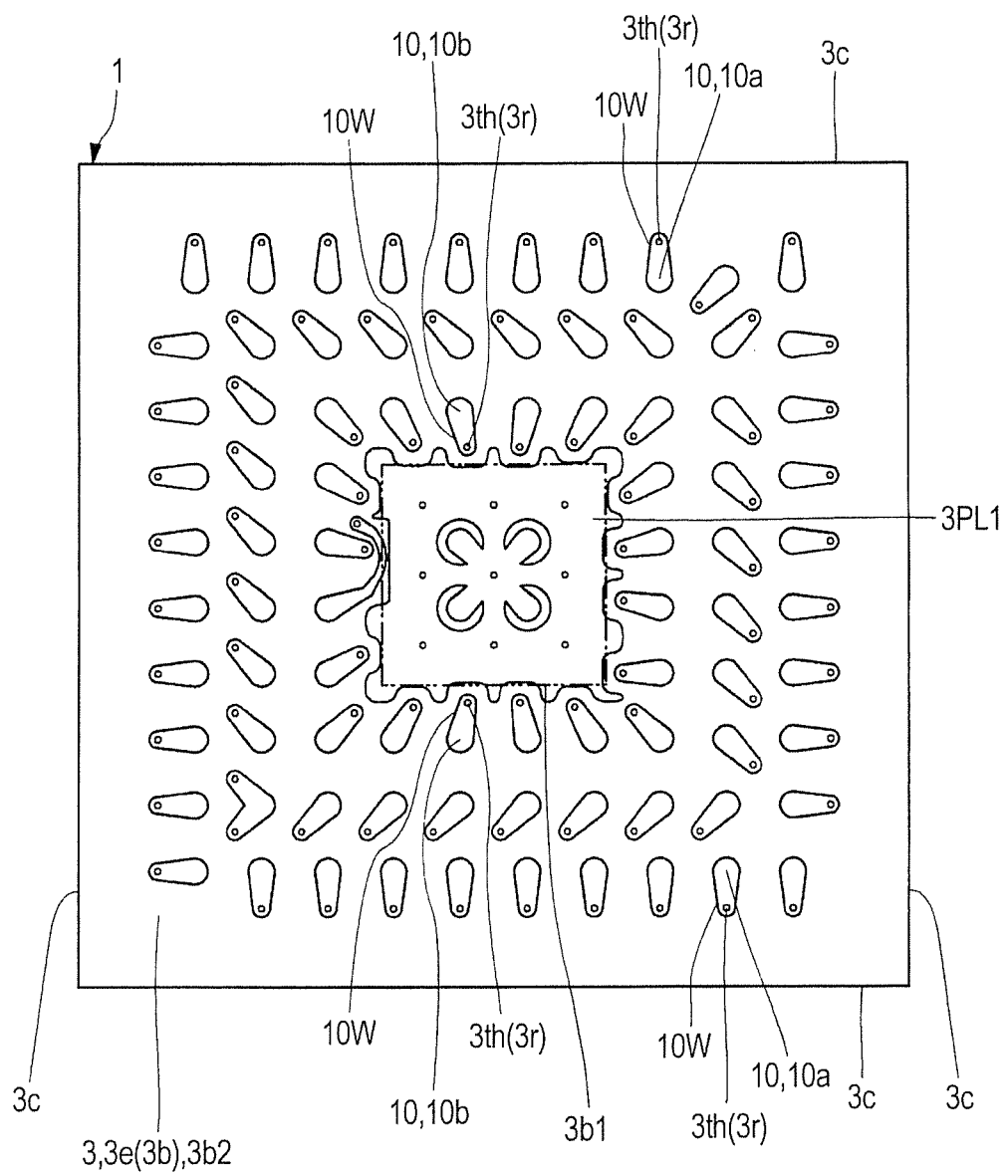
FIG. 6 is a plan view showing a state in which a solder resist film shown in FIG. 5 is removed.

A technology described in an embodiment below is widely applicable to area array-type semiconductor devices, where multiple external electrode pads are disposed in a matrix over the mounting surface of a wiring board (interposer board). In the present embodiment, there will be described a mode in which the technology is applied to a ball grid array (BGA)-type semiconductor device, where solder balls are joined to external electrode pads. FIG. 1 is a perspective view of a semiconductor device according to the present embodiment. FIG. 2 is a bottom view of the semiconductor device shown in FIG. 1. FIG. 3 is a perspective plan view showing the internal structure of the semiconductor device over a wiring board in a state in which a sealing body shown in FIG. 1 is removed. FIG. 4 is a sectional view taken along line A-A of FIG. 1. FIG. 5 is a plan view showing a state in which solder balls shown in FIG. 2 are removed. FIG. 6 is a plan view showing a state in which a solder-resist film shown in FIG. 5 is removed.

While FIGS. 1 to 6 show an example of a reduced number of external terminals, 84 terminals, for better viewability, the number of terminals (for example, the respective numbers of bonding leads 3d, lands 10, and solder balls 7 shown in FIG. 4) is not limited to the number shown in FIGS. 1 to 6. The present technology is applicable to, for example, semiconductor devices where the respective numbers of the terminals, such as the bonding leads 3d, the lands 10, and the solder balls 7, are about 50 to 500. While FIG. 4 illustrates a wiring board 3 where a wiring layer is formed over each of the upper and lower surfaces of a core layer 3e, a structure including more than two wiring layers may be employed. In FIGS. 5 and 6, a region 3b1 overlapped by the semiconductor chip shown in FIG. 3 in the thickness direction (chip back region) is shown by a chain double-dashed line to clearly show the boundaries of the region.

Semiconductor Device

First, the configuration of a semiconductor device 1 according to the present embodiment will be outlined with reference to FIGS. 1 to 6. The semiconductor device 1 according to the present embodiment includes a semiconductor chip 2 (see FIGS. 3 and 4) and a wiring board 3 over which the semiconductor chip 2 is mounted. As shown in FIG. 4, the semiconductor chip 2 is mounted over the upper surface (surface, chip mounting surface) of the wiring board 3a and covered by a sealing body (resin body) 4.

The sealing body 4 has an upper surface (surface) 4a, a lower surface (surface) 4b (see FIG. 4) opposite to the upper surface 4a, and side surfaces 4c between the upper surface 4a and the lower surface 4b. The sealing body 4 has a rectangular shape in a plan view. In an example shown in FIG. 1, the plane area of the sealing body 4 (the area of the upper surface 4a in a plan view) is the same as that of the wiring board 3, and the side surfaces 4c of the sealing body 4 communicate with side surfaces 3c of the wiring board 3. The plane dimensions (the dimensions in a plan view) of the sealing body 4 form, for example, a square with each side about 10 to 23 mm long. The thickness (height) of the sealing body 4, that is, the distance from the upper surface 4a to the lower surface 4b shown in FIG. 4 is, for example, about 0.5 to 1.2 mm.

As shown in FIGS. 3 and 4, the semiconductor chip 2 mounted over the wiring board 3 has a front surface (principal surface, upper surface) 2a, a back surface opposite to the front surface 2a (principal surface, lower surface) 2b (see FIG. 4), and side surfaces 2c between the front surface 2a and the back surface 2b (see FIG. 4). The semiconductor chip 2 has a rectangular shape in a plan view. The plane dimensions of the semiconductor chip 2 form, for example, a rectangle with one side about 4 to 12 mm long. The thickness (height) of the semiconductor chip 2 is, for example, about 0.1 to 0.4 mm.

Multiple pads (electrode pads, chip electrodes) PD are formed over the front surface 2a of the semiconductor chip 2. In the present embodiment, as shown in FIG. 3, the pads PD are formed along each side of the front surface 2a. Although not shown, multiple semiconductor elements (circuit elements) are also formed over the principal surface of the semiconductor chip 2 (specifically, a semiconductor element formation region of a semiconductor element formation surface of a semiconductor substrate serving as the substrate of the semiconductor chip 2). The pads PD are electrically connected with the semiconductor elements through wires (not shown) formed in a wiring layer in the semiconductor chip 2 (specifically, a wiring layer between the front surface 2a and the semiconductor element formation region (not shown).

The semiconductor chip 2 (specifically, the semiconductor substrate serving as the substrate of the semiconductor chip 2) is comprised of, e.g., silicon (Si). Also formed over the front surface 2a is an insulating film covering the substrate and wires of the semiconductor chip 2. The front surfaces of the pads PD are exposed from the insulating film through apertures formed in the insulating film. The pads PD are comprised of a metal, e.g., aluminum (Al).

The semiconductor chip 2 is mounted over the upper surface 3a of the wiring board 3. In an example shown in FIG. 3, the semiconductor chip 2 is mounted in the center of the upper surface 3a of the wiring board 3. As shown in FIG. 4, the semiconductor chip 2 is mounted over the wiring board 3 with a die bonding material (adhesive) 5 therebetween with the back surface 2b opposed to the upper surface 3a of the wiring board 3. That is, the semiconductor chip 2 is mounted over the wiring board 3 by so-called face-up mounting, in which the surface (back surface 2b) opposite to the front surface (principal surface) 2a over which the pads PDs are formed is opposed to the chip mounting surface (upper surface 3a).

The die bonding material 5 is an adhesive for bonding and fixing the semiconductor chip 2 to the wiring board 3 and may be, for example, a resin film called die attach film (DAF). Note that the die bonding material 5 is not limited to a DAF and may be a liquid adhesive. As for DAFs or liquid adhesives, those including an epoxy resin as a main component are often used. To improve heat dissipation characteristics of dissipating heat from the semiconductor chip 2 to the wiring board 3, the die bonding material 5 preferably includes particles having higher thermal conductivity than resin components, such as metal particles.

As shown in FIG. 4, the wiring board 3 has the upper surface (surface, first principal surface, chip mounting surface) 3a over which the semiconductor chip 2 is mounted, the lower surface opposite to the upper surface 3a (surface, second principal surface, mounting surface) 3b opposite to the upper surface 3a, and the side surfaces 3c between the upper surface 3a and the lower surface 3b. As shown in FIGS. 2 and 3, the wiring board 3 has a rectangular shape in a plan view. As described above, in the example shown in FIG. 1, the plane area of the wiring board 3 is the same as that of the sealing body 4. The plane dimensions of the wiring board 3 form, for example, a square with each side about 10 to 23 mm long. The thickness (height) of the wiring board 3, that is, the distance from the upper surface 3a to the lower surface 3b shown in FIG. 4 is, for example, about 0.2 to 0.6 mm.

The wiring board 3 includes the multiple wiring layers (two layers, the upper and lower wiring layers, in the example shown in FIG. 4). A core layer (insulating layer) 3e disposed between the wiring layers is comprised of, for example, prepreg obtained by impregnating a glass fiber or carbon fiber with a resin. Multiple bonding leads 3d are formed over the upper surface of the core layer 3e, and multiple lands 10 are formed under the lower surface thereof. The bonding leads 3d and the lands 10 are electrically coupled together.

As shown in FIG. 3, the bonding leads (terminals, chip mounting surface terminals, pads, bonding pads) 3d are formed over the upper surface 3a of the wiring board 3. The bonding leads 3d are disposed around the chip-mounted region having the semiconductor chip 2 therein along each side of the semiconductor chip 2. Specifically, a solder resist film (insulating layer) 3f covering the wires formed over the upper surface of the core layer (insulating layer) 3e is formed over the upper surface 3a of the wiring board 3. The bonding leads 3d are exposed from apertures 3fk1 formed in the solder resist film 3f. The pads PD over the semiconductor chip 2 and the bonding leads 3d over the wiring board 3 are electrically coupled together through multiple wires (conductive members) 6. The wires 6 are often formed of a metal including gold (Au) or copper (Cu) as a main component.

In the present embodiment, the semiconductor chip 2 is mounted over the wiring board 3 by face-up mounting. Accordingly, the bonding leads 3d are disposed around the chip-mounted region, and the wires 6 are jointed to the bonding leads 3d. Note that if face-down mounting (flip-chip coupling) is used as a modification, the bonding leads 3d are disposed in the chip-mounted region (positions opposite to the pads PD). In this case, the bonding leads 3d are electrically connected with the pads PD through conductive members (not shown), such as bump electrodes.

As shown in FIG. 5, the lands (external terminals, electrode pads, external electrode pads) 10 are formed under the lower surface 3b of the wiring board 3. The lands 10 are arranged in a matrix form (in an array form). As shown in FIG. 4, the lands 10 are electrically connected with the bonding leads 3d through multiple wires 3r formed in the wiring board 3. That is, the lands 10 are electrically connected with the semiconductor chip 2 and serve as external terminals for electrically coupling the semiconductor chip 2 and external devices. Such a semiconductor device, in which external terminals are arranged in a matrix form over the mounting surface of a wiring board is called an area array-type semiconductor device. In this area array-type semiconductor device, it is possible to effectively use the mounting surface (the lower surface 3b) of the wiring board 3 as space for arranging external terminals. Thus, even when the number of external terminals is increased, an increase in the mounting area of the semiconductor device can be favorably prevented. That is, it is possible to mount, in a space-saving manner, a semiconductor device which has an increased number of external terminals due to higher functionality and integration.

As shown in FIG. 6, a conductor pattern (conductor plane, solid filling) 3PL1 having a larger plane area than a land 10 is formed under the lower surface 3b of the wiring board 3. In the present embodiment, the conductor pattern 3PL1 is disposed as heat dissipation paths for dissipating heat transmitted from the semiconductor chip 2 out of the semiconductor device 1. For this reason, as shown in FIG. 4, the conductor pattern 3PL1 is disposed in a position overlapped by the semiconductor chip 2 in the thickness direction. That is, as shown in FIG. 6, the conductor pattern 3PL1 is disposed in the center of the lower surface 3b of the wiring board 3. The lands 10 are disposed around the conductor pattern 3PL1. The configuration of the conductor pattern 3PL1 will be described in detail later.

The bonding leads 3d, the lands 10, and the wires 3r, which constitute a conducting path of the wiring board 3, are formed by patterning a metal film and comprised of, e.g., a conductive layer including copper (Cu) as a main component. Of the wires 3r, an inter-layer conductor 3th (wire 3r, via wire, through-hole wire) for electrically coupling the upper and lower surfaces of the core layer 3e is formed by, for example, embedding a metal film in a through hole and comprised of, e.g., a conductive film including copper (Cu) as a main component. The conductor pattern 3PL1 is comprised of the same metal material as the lands 10. Examples of the conductive film including copper as a main component include copper alone, copper alloys, and metal films formed by laminating, over a copper film, another metal film (e.g., nickel film, etc.). For example, in the present embodiment, a metal member comprised of copper (Cu) is used as a substrate. The front surface of the substrate is covered by, e.g., a metal film comprised of nickel (Ni).

As shown in FIG. 4, the lands 10 are exposed from a solder resist film (insulating film) 3h covering the lower surface 3b of the wiring board 3. Specifically, the solder resist film (insulating film) 3h covering the upper surface of the core layer 3e is formed as the lower surface 3b of the wiring board 3, and a portion of each land 10 and portions of the conductor pattern 3PL1 are covered by the solder resist film 3h. Multiple apertures 3k1 and multiple apertures 3k2 are formed in the solder resist film 3h. The lands 10 are exposed from the apertures 3k1 formed in the solder resist film 3h. Portions of the conductor patterns 3PL1 are exposed from the solder resist film 3h through the apertures 3k2 formed in the solder resist film 3h.

Figure 7:
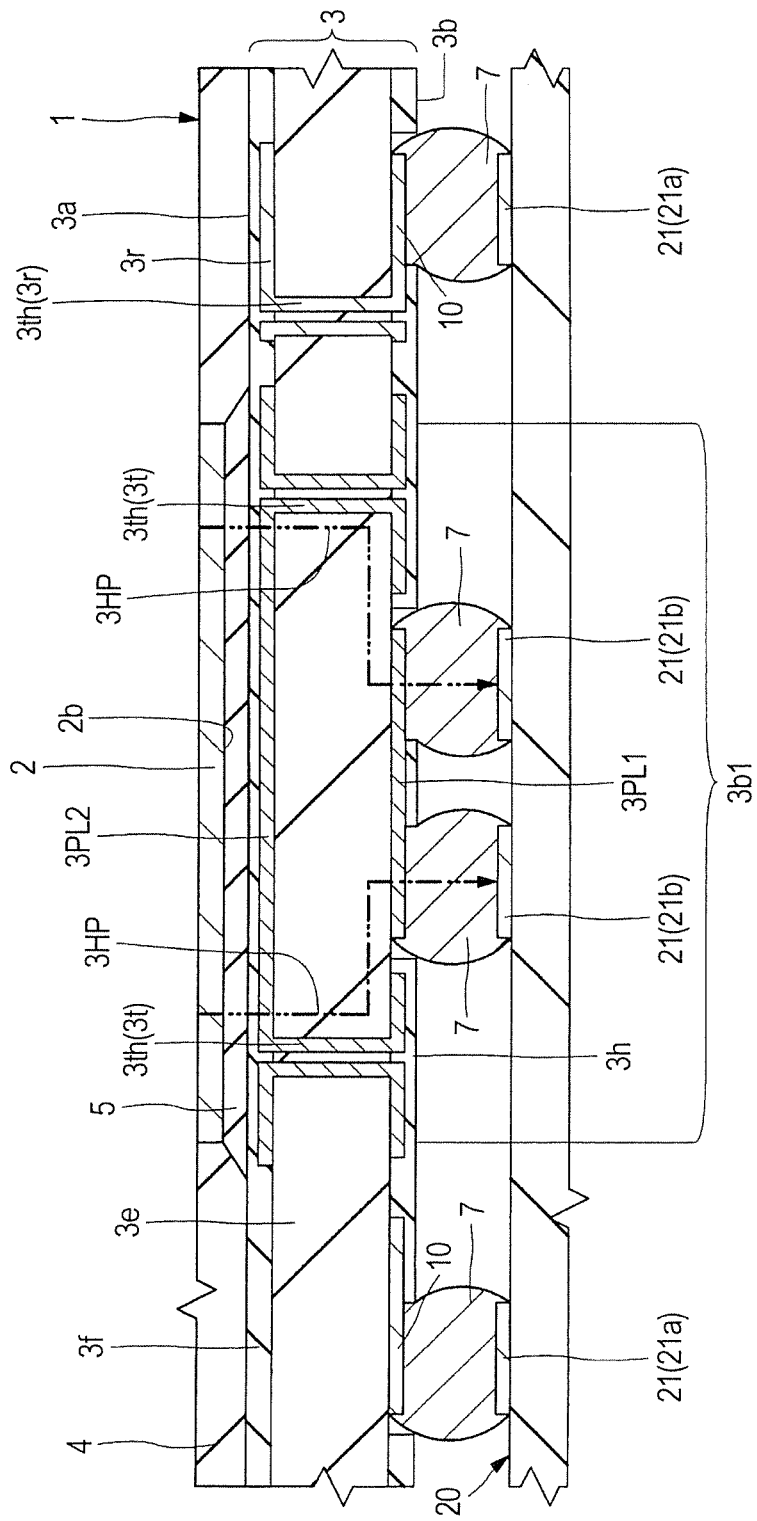
FIG. 7 is an enlarged sectional view showing a state in which a conductor pattern for heat dissipation shown in FIG. 4 and terminals of a mounting substrate are electrically coupled together through solder balls.
Figure 8:
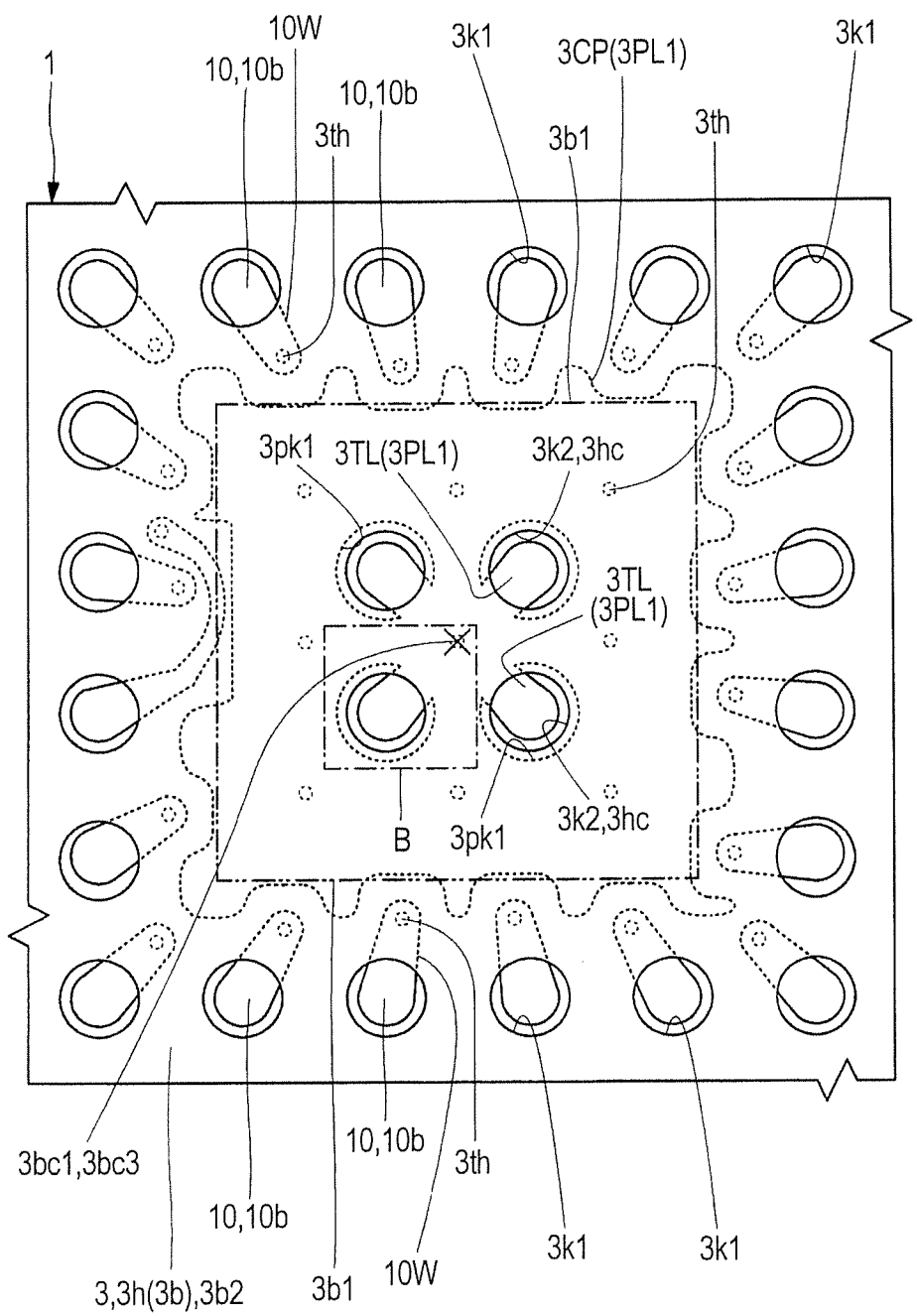
FIG. 8 is an enlarged plan view showing the vicinity of the back side of the chip-mounted region of the wiring board shown in FIG. 5.
Figure 9:
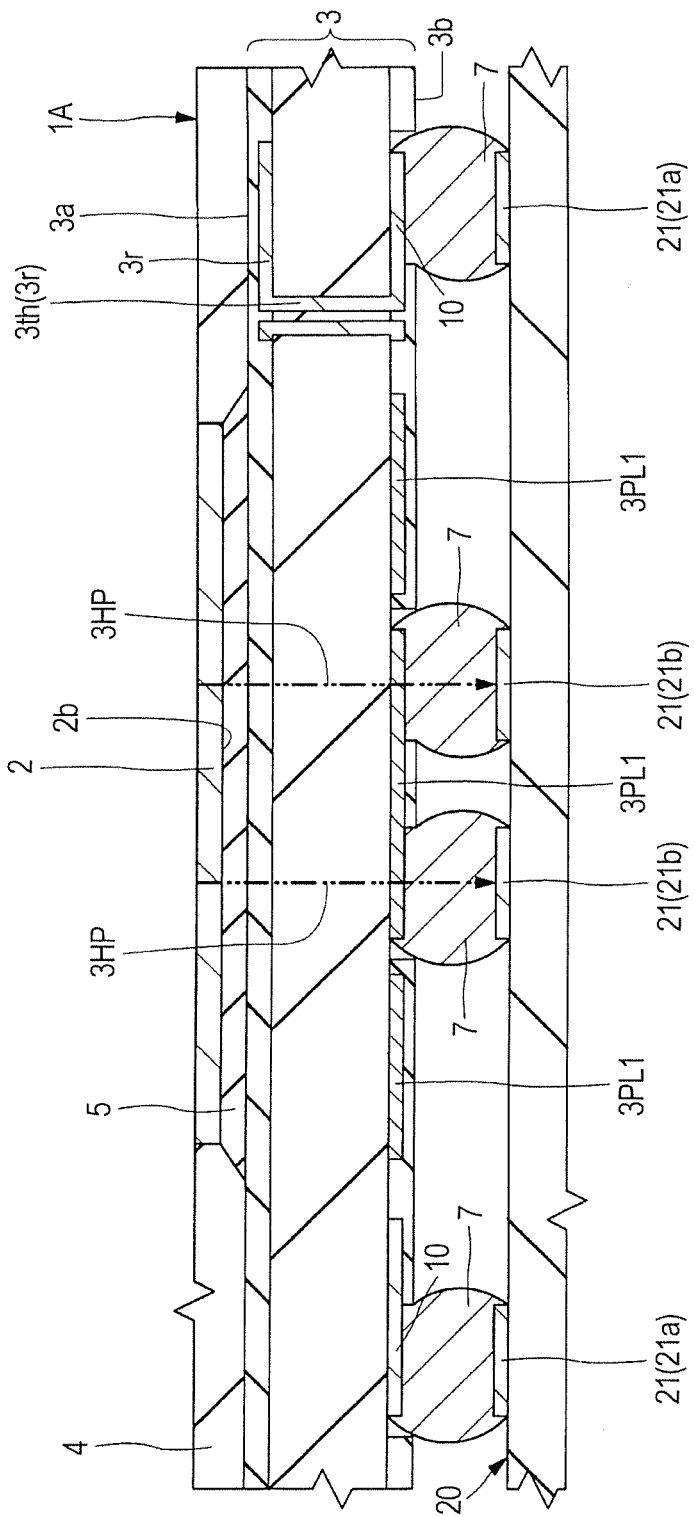
FIG. 9 is an enlarged sectional view showing a modification to FIG. 7.
Figure 10:
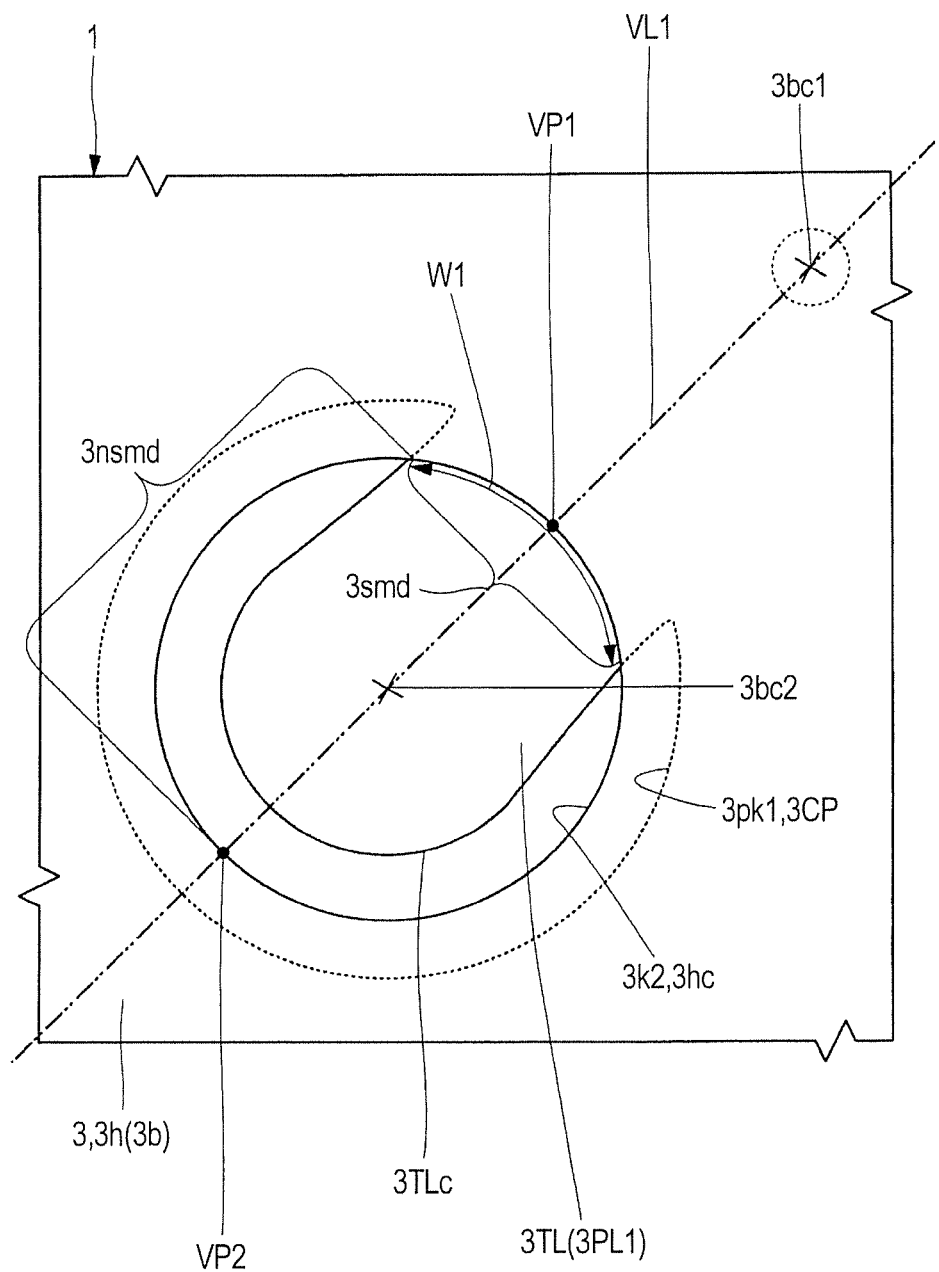
FIG. 10 is an enlarged plan view of a portion B shown in FIG. 8.
Figure 11:
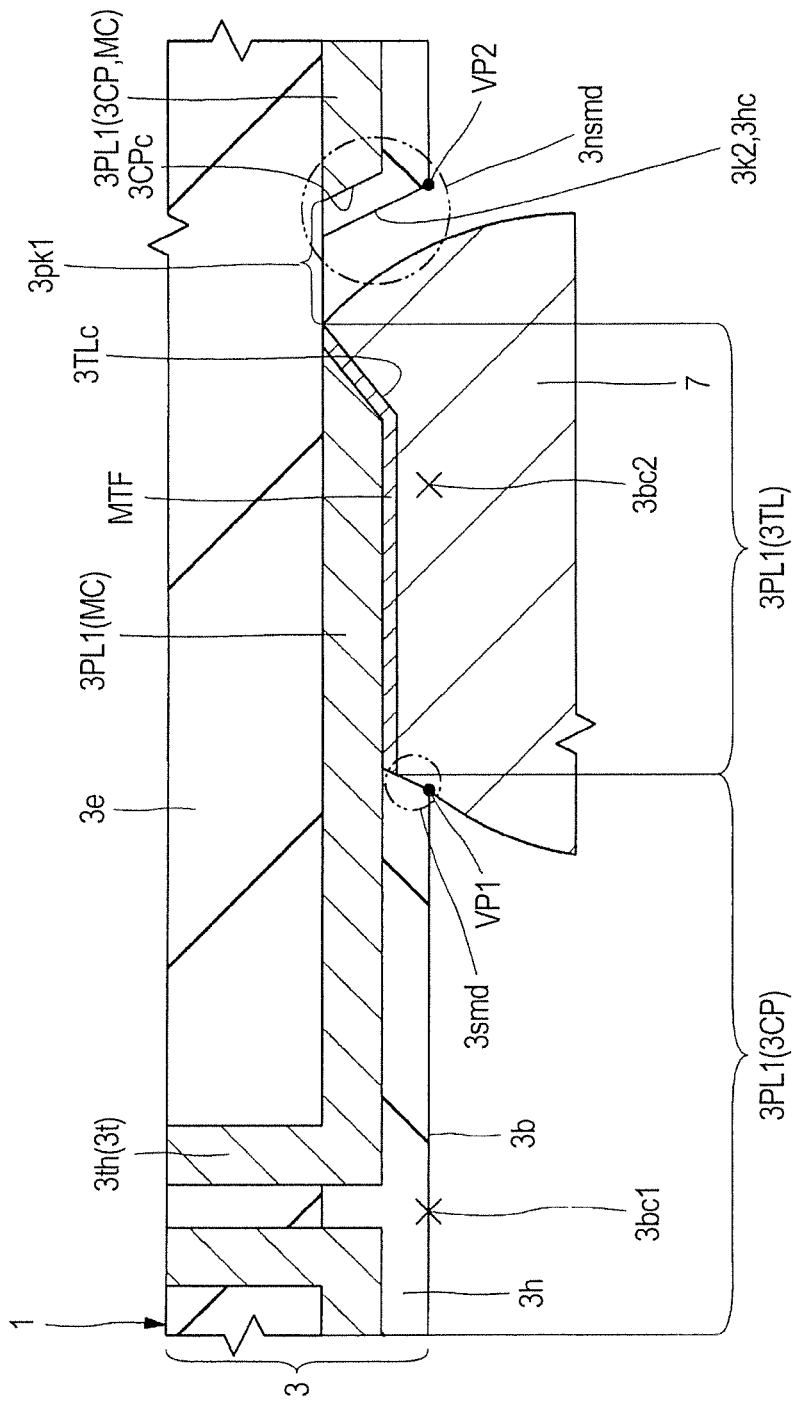
FIG. 11 is an enlarged sectional view taken along a virtual straight line shown in FIG. 10.
Figure 12:
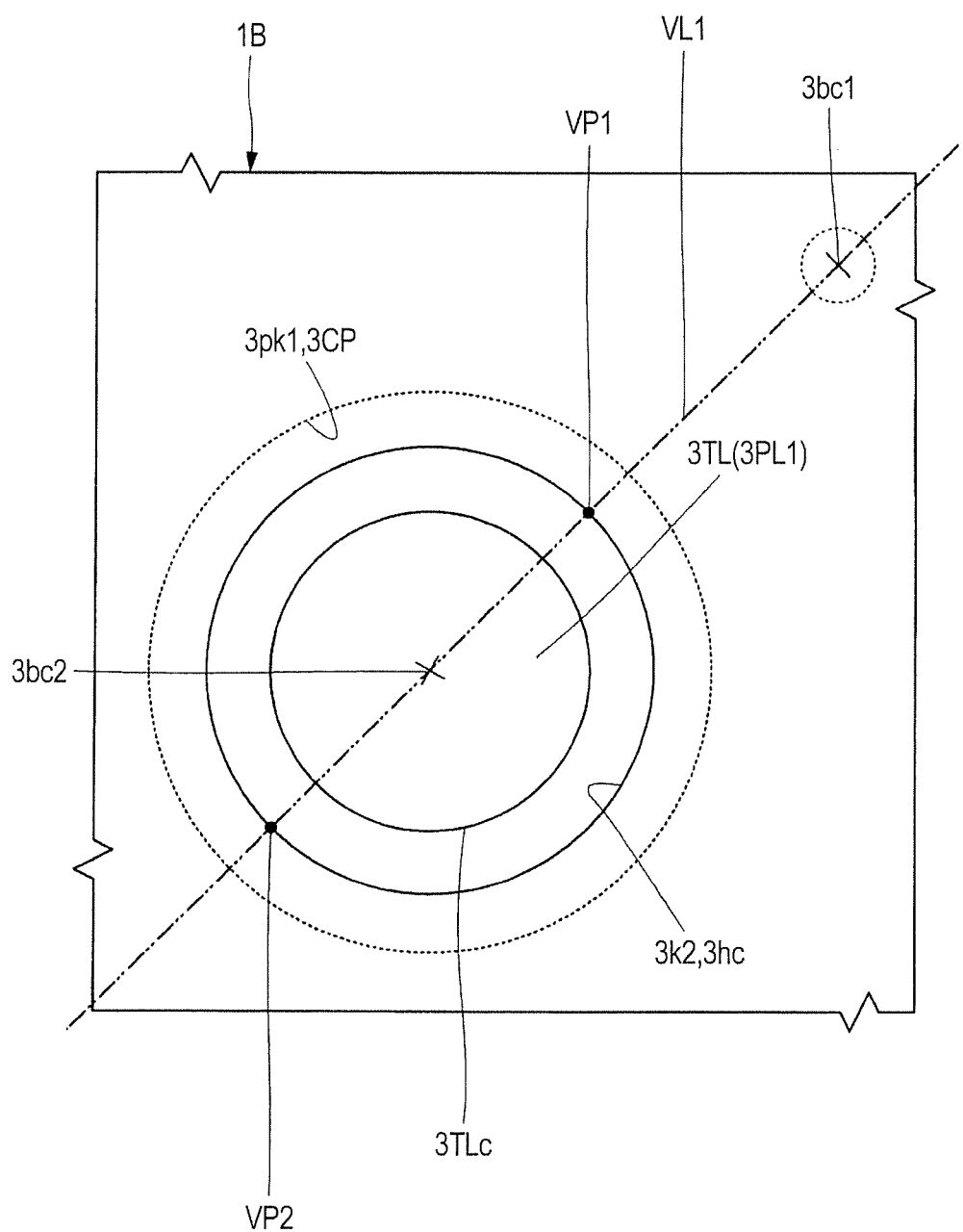
FIG. 12 is an enlarged plan view showing a modification to FIG. 10.
Figure 13:
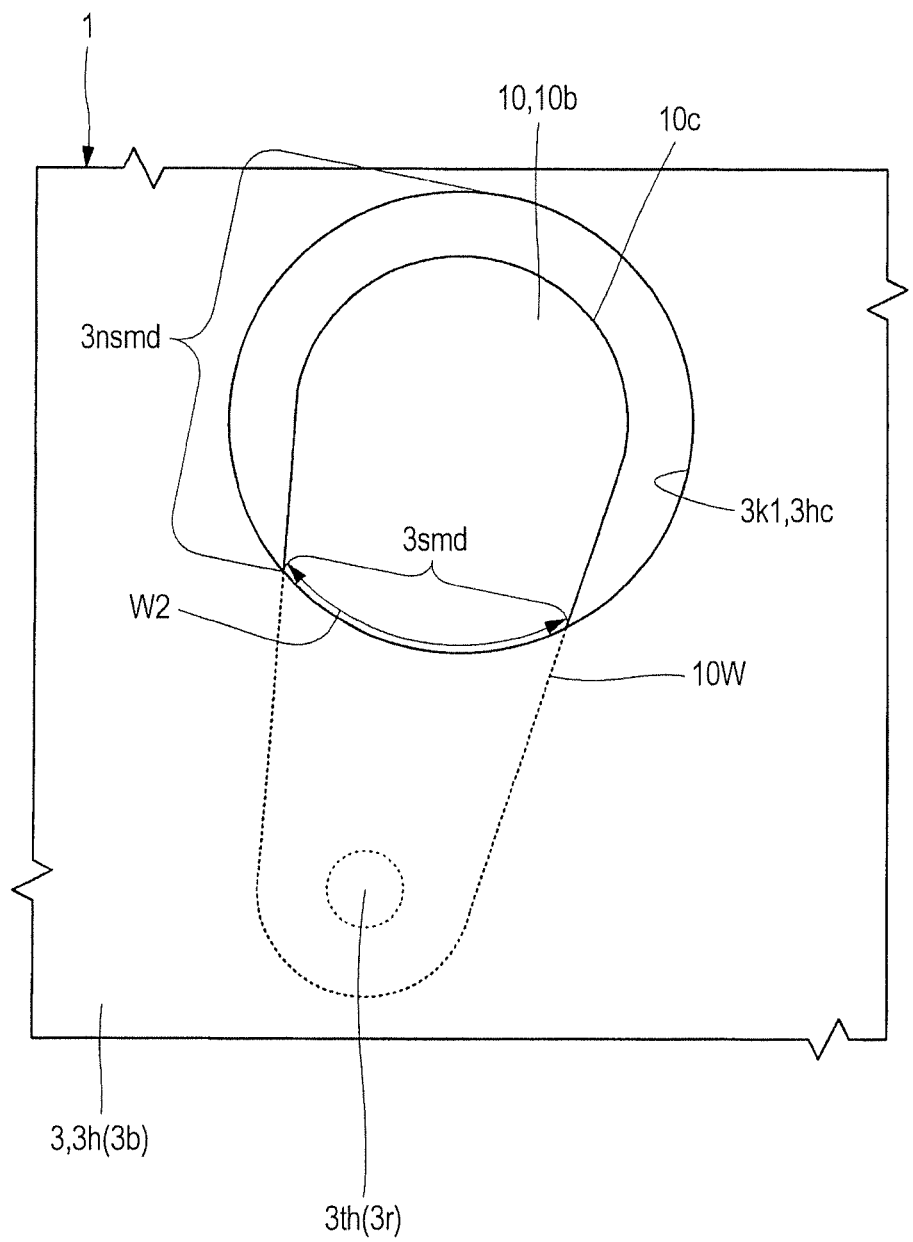
FIG. 13 is an enlarged plan view showing one of multiple lands shown in FIG. 8.
Figure 23:
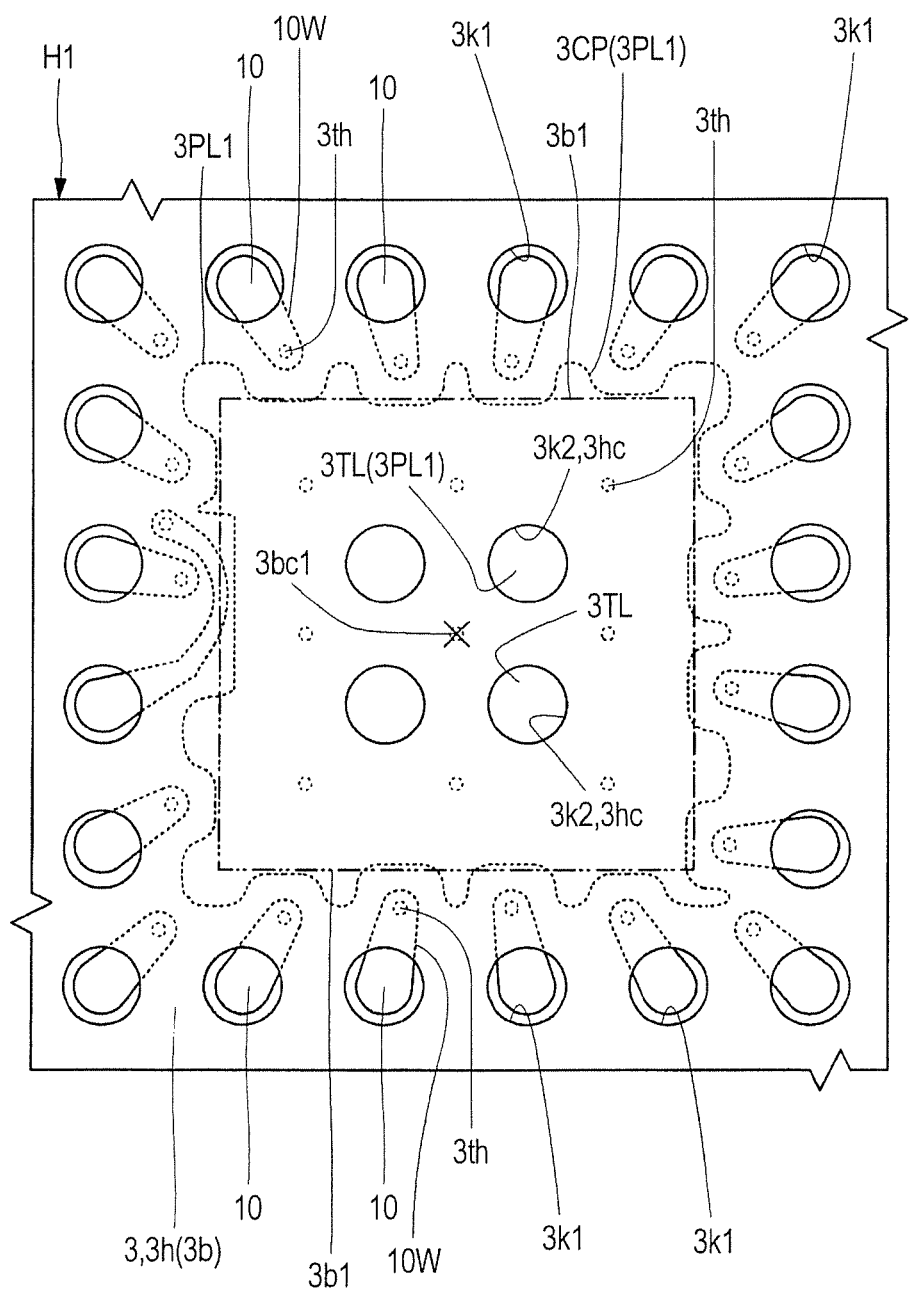
FIG. 23 is an enlarged plan view showing an example of consideration to FIG. 8.
Figure 24:
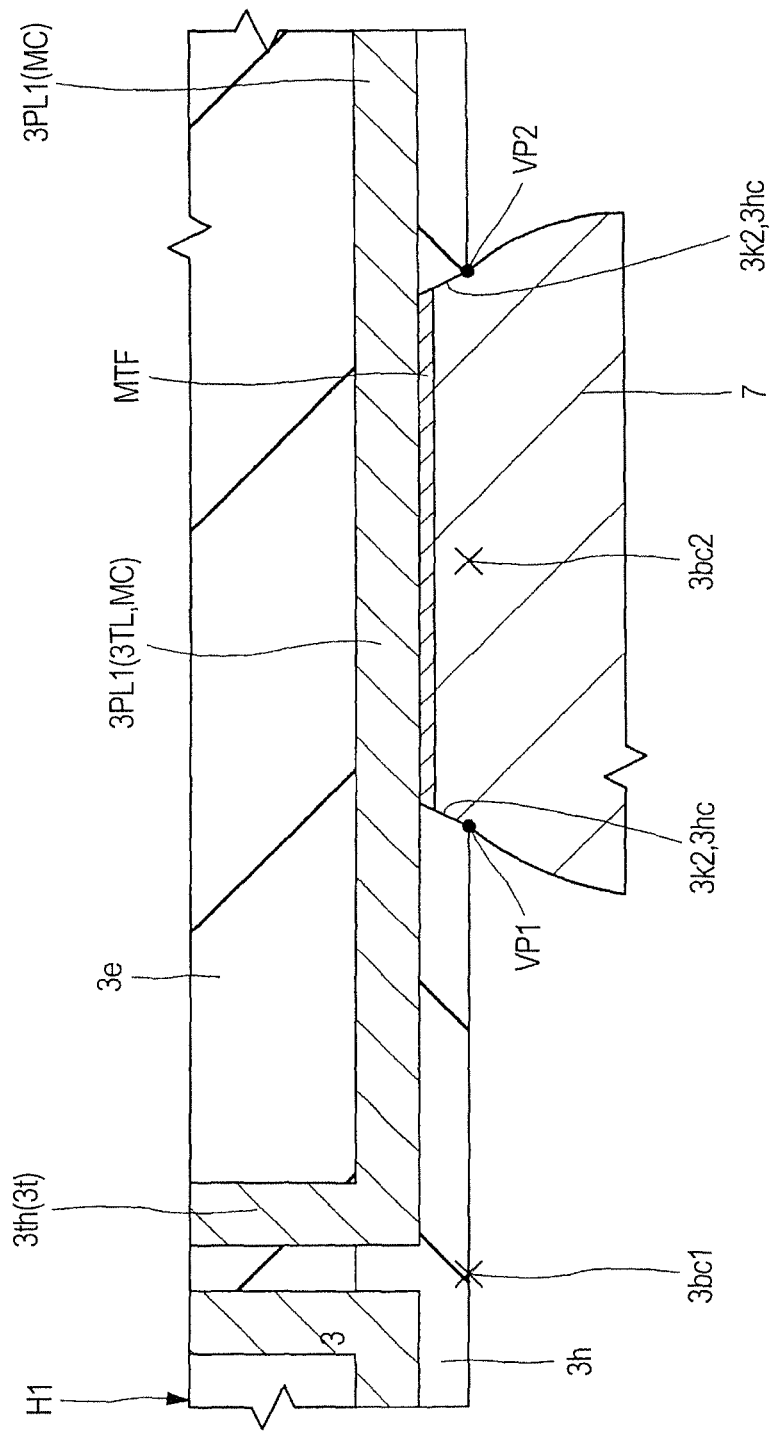
FIG. 24 is an enlarged sectional view showing an example of consideration to FIG. 11 and corresponds to a section of one aperture shown in FIG. 23.

In the present embodiment, solder balls (solder) 7 are joined to the lands 10 in the apertures 3k1. Further, solder balls 7 are joined to the conductor patterns 3PL1 in the apertures 3k2. That is, the semiconductor device 1 is a BGA-type semiconductor device, where the solder balls 7 are disposed in a matrix form. When mounting the semiconductor device 1 on a mounting substrate (not shown), the solder balls 7 serve as conductive coupling members for electrically coupling terminals of the mounting substrate and the semiconductor device 1. The solder balls 7 are comprised of so-called lead-free solder, which includes substantially no lead (Pb) and, for example, comprised of tin (Sn) alone, tin-bismuth (Sn—Bi), tin-silver-copper (Sn—Ag—Cu), or the like. As used herein, the lead-free solder refers to solder whose lead (Pb) content is 0.1 wt % or less. This content is standardized by a Restriction of Hazardous Substances (RoHs) directive. Details of Mounting Surface of Wiring Board Next, the structure of the mounting surface of the wiring board 3 shown in FIGS. 1 to 6 will be described in detail. FIG. 7 is an enlarged sectional view showing a state in which the conductor pattern for heat dissipation shown in FIG. 4 and the terminals of the mounting substrate are electrically coupled together through the solder balls. FIG. 8 is an enlarged plan view showing the vicinity of the back side of the chip-mounted region of the wiring board shown in FIG. 5. FIG. 9 is an enlarged sectional view showing a modification to FIG. 7. FIG. 10 is an enlarged plan view of a portion B shown in FIG. 8. FIG. 11 is an enlarged sectional view taken along a virtual straight line shown in FIG. 11. FIG. 23 is an enlarged plan view showing an example of consideration to FIG. 8. FIG. 24 is an enlarged sectional view showing an example of consideration to FIG. 11 and corresponds to a section of one aperture shown in FIG. 23. FIG. 12 is an enlarged plan view showing a modification to FIG. 10. FIG. 13 is an enlarged plan view showing one of multiple lands shown in FIG. 8.

In FIG. 8, the region (chip-back region) 3b1, overlapped by the semiconductor chip shown in FIG. 3 in the thickness direction, is bounded by a chain double-dashed line to clearly show the region. To clearly show the center 3bc1 of the region 3b1, the center 3bc1 is represented by a cross mark (x) in FIGS. 8, 10, 11, and 12. Similarly, to clearly show the center 3bc2 of the aperture 3k2, the center 3bc2 is represented by a cross mark (x) in FIGS. 10 and 12. Further, a virtual straight line VL1 passing through the center 3bc1 of the region 3b1 (see FIG. 8) and the center 3bc2 of the aperture 3k2 is represented by a chain double-dashed line in FIGS. 10 and 12.

Conceivable examples of the mounting mode of the semiconductor device 1 shown in FIGS. 1 to 6 include a mode where the semiconductor device 1 is mounted over a mounting substrate (motherboard) 20 as shown in FIG. 7 and then used. In this case, by electrically coupling the lands 10 included in the semiconductor device 1 and terminals 21 (electrode terminals 21a) of the mounting substrate 20 through the solder balls 7, it is possible to electrically couple a circuit formed in the semiconductor chip 2 and external devices (not shown) mounted over the mounting substrate 20.

In the present embodiment, as described above, the conductor pattern (conductor plane, solid filling) 3PL1 having a larger plane area than each land 10 is disposed in the position overlapped by the semiconductor chip 2 (see FIG. 4) in the thickness direction. The conductor pattern 3PL1 is comprised of a conductor material having higher thermal conductivity than the solder resist film 3h or core layer 3e. In the present embodiment, the conductor pattern 3PL1 is formed of the same metal material as the lands 10.

By coupling the conductor pattern 3PL1 and the terminals 21 (heat dissipation terminals 21b) of the mounting substrate 20 through the solder balls 7 to mount the semiconductor device 1 over the mounting substrate 20, it is possible to form heat dissipation paths 3HP which transmit heat from the wiring board 3 toward the mounting substrate 20 more efficiently than other regions, as schematically shown by arrows in FIG. 7.

Electrical characteristics of the circuit formed over the semiconductor device 1 vary due to the effect of heat. For this reason, in order to increase the operation reliability of the semiconductor device 1, it is preferred to improve the heat dissipation characteristics to stabilize the temperature of the semiconductor device 1. Further, to improve the heat dissipation characteristics as designed, it is preferred to improve the coupling reliability of the junctions between the conductor pattern 3PL1 and the heat dissipation terminals 21b of the mounting substrate 20 forming the heat dissipation paths 3HP.

Further, to improve the heat dissipation characteristics of the semiconductor device 1, it is preferred to reduce the path length from the semiconductor chip 2 acting as a heat source to the ends (the solder balls 7 in FIG. 7) of the heat dissipation paths 3HP (heat dissipation path length). As shown in FIG. 7, by disposing the conductor pattern 3PL1 in the position overlapped by the semiconductor chip 2 in the thickness direction, the path length of the heat dissipation paths 3HP can be reduced.

The heat dissipation efficiency becomes higher as the sectional areas of the heat dissipation paths 3HP are increased. Accordingly, the heat dissipation characteristics can be improved as the plane area of the conductor pattern 3PL1 for heat dissipation is increased. In the present embodiment, as shown in FIG. 8, the plane area of the conductor pattern 3PL1 is larger than the area of each of the lands 10. The area of each of the apertures 3k2 formed in the solder resist film 3h shown in FIG. 8 is the same as the area of each of the apertures 3k1 through which the lands 10 are exposed. In an example shown in FIG. 8, the conductor pattern 3PL1 has apertures 3k2 in four positions. In the example shown in FIG. 8, the plane area of the conductor pattern 3PL1 is four times or more as large as the area of the apertures 3k2.

Further, in the example shown in FIG. 8, the conductor pattern 3PL1 has a plane area that covers most of the region 3b1, overlapped by the semiconductor chip 2 (see FIG. 7) in the thickness direction. In other words, at least one of the four sides forming the outline of the region 3b1 is covered by the conductor pattern 3PL1. As seen above, since the region 3b1, overlapped by the semiconductor chip 2 in the thickness direction, is mostly covered by the conductor pattern 3PL1, it is possible to efficiently dissipate heat transmitted from the back surface 2b of the semiconductor chip 2 shown in FIG. 7 in the thickness direction of the wiring board 3.

As shown in FIG. 8, the conductor pattern 3PL1 include a covered portion 3CP covered by the solder resist film 3h and multiple exposed portions 3TL which are exposed from the solder resist film 3h through the apertures 3k2 formed in the solder resist film 3h. As shown in FIG. 7, when the semiconductor device 1 and the mounting substrate 20 are coupled together through the solder balls 7, the solder balls 7 form part of the heat dissipation paths 3HP. Accordingly, to improve the heat dissipation efficiency, it is preferred to increase the number of the solder balls 7 connected with the conductor pattern 3PL1. In the present embodiment, by forming the apertures 3k2 in the multiple positions (four positions in FIG. 8) and then disposing the multiple (four in FIG. 8) exposed portions 3TL as shown in FIG. 8, it is possible to couple the multiple (e.g., four) solder balls (see FIG. 7) to the conductor pattern 3PL1.

As seen in a semiconductor device 1A serving as a modification shown in FIG. 9, by forming the conductor pattern 3PL1 over the lower surface 3b of the wiring board 3 and then coupling the conductor pattern 3PL1 and the mounting substrate 20 through the solder balls 7, the heat dissipation characteristics can be improved. The reason is that by dissipating heat from the conductor pattern 3PL1 toward the mounting substrate 20, a temperature gradient is formed from the back surface 2b of the semiconductor chip 2 toward the conductor pattern 3PL1 in the thickness direction.

Note that by, as shown in FIG. 7, forming a conductor pattern (conductor plane, solid filling) 3PL2 between the semiconductor chip 2 and the conductor pattern 3PL1 and then coupling the conductor pattern 3PL1 and the conductor pattern 3PL2 through inter-layer conductors 3th (heat dissipation conductors 3t), the heat dissipation efficiency can be further increased. Specifically, in the semiconductor device 1 shown in FIG. 7, the conductor pattern 3PL2 is formed in the position overlapped by the semiconductor chip 2 in the thickness direction under the upper surface 3a serving as the chip mounting surface of the wiring board 3. Although not shown, the conductor pattern 3PL2, for example, has a larger plane area than the back surface 2b of the semiconductor chip 2 and is disposed opposite to the back surface 2b of the semiconductor chip 2. The inter-layer conductors 3th (heat dissipation conductors 3t) for coupling the conductor pattern 3PL1 and the conductor pattern 3PL2 are disposed therebetween. In this case, the heat dissipation paths 3HP are each comprised of a member (conductor member, metal member) having higher thermal conductivity than the core layer 3e. For this reason, the semiconductor device 1 shown in FIG. 7 shows higher heat dissipation performance than the semiconductor device 1A shown in FIG. 9.

One conceivable modification (not shown) to FIG. 8 is a mode where the area of each aperture 3k2 is made larger than that of each aperture 3k1 and where the exposed area of each exposed portion 3TL of the conductor pattern 3PL1 is made larger than that of each land 10. In this case, the contact area between the conductor pattern 3PL1 and the solder balls 7 (see FIG. 7) is increased. Accordingly, the sectional area of each heat dissipation path 3HP (see FIG. 7) can be increased.

Note that, in this case, the solder balls 7 forming parts of the heat dissipation paths 3HP shown in FIG. 7 differ in shape from the solder balls 7 connected with the lands 10. For this reason, when mounting the semiconductor device 1, the coplanarity of the heights of the lowest points of the solder balls 7 tends to decrease. Accordingly, to improve the coplanarity to easily couple the solder balls 7 to the mounting substrate 20, the area of each of the apertures 3k2 formed in the solder resist film 3h shown in FIG. 8 is preferably the same as the area of each of the apertures 3k1 from which the lands 10 are exposed. Similarly, the exposed area of each exposed portion 3TL of the conductor pattern 3PL1 is preferably the same as that of each land 10.

By employing a structure where the conductor pattern 3PL1 has no aperture (conductor aperture), like a semiconductor device H1 shown in FIGS. 23 and 24, it is possible to further increase the plane area of the conductor pattern 3PL1. That is, if attention is paid only to an increase in the sectional area of each heat dissipation path, the semiconductor device H1 is more preferable than the semiconductor device 1 shown in FIG. 8.

However, an examination by the inventors of the present application has revealed that the semiconductor device H1 has a problem associated with the coupling reliability of the junctions between the conductor pattern 3PL1 forming the heat dissipation paths and the heat dissipation terminals 21b (see FIG. 7) of the mounting substrate 20 (see FIG. 7). Specifically, the examination has revealed that in the semiconductor device H1, the solder balls 7 connected with the conductor pattern 3PL1 tend to be broken under repeated temperature cyclic loading.

In the semiconductor device H1 shown in FIG. 23, the entire boundary of each exposed portion 3TL of the conductor pattern 3PL1 overlaps (matches) the outline of the corresponding aperture 3k2. In other words, the conductor pattern 3PL1 is disposed over all of an aperture side surface 3hc forming the outline of each aperture 3k2 forming a circle. In other words, as shown in FIG. 24, the region in which the solder ball 7 is to be embedded (the exposed region of the conductor pattern 3PL1) is defined by the aperture 3k2 formed in the solder resist film 3h. That is, the region has a so-called SMD structure.

In an SMD structure, the shape of the solder ball 7 is defined by the aperture side surface 3hc of the aperture 3k2 formed in the solder resist film 3h. For this reason, as shown in FIG. 24, inflection points occur on portions of the solder ball 7 which are in contact with the aperture side surface 3hc of the solder resist film 3h (in particular, at intersections VP1 and VP2 shown in FIG. 24). Normally, the solder ball 7 itself attempts to take a shape close to a sphere due to the surface tension of the solder material and is therefore unlikely to be broken unless an external factor causes inflection points. However, if the solder ball 7 having inflection points thereon as shown in FIG. 24 is put under repeated temperature cyclic loading, stress caused by the temperature cyclic loading is easily concentrated on the inflection points of the solder ball 7. As a result, cracks are believed to occur from the inflection points of the solder ball 7. Once the cracks have occurred, stress caused by the temperature cyclic loading tends to be concentrated on the cracks. Thus, the cracks develop, causing breakage of the solder ball 7.

If the solder ball 7 is not used as an electrode, an electrical failure, such as a conduction failure, does not occur immediately even when the solder ball 7 is broken. However, as described above, it is preferred to stabilize the temperature of the semiconductor device 1 by improving the heat dissipation characteristics as designed to increase the operation reliability of the semiconductor device 1. In view of the foregoing, the inventors of the present application have considered a technology for preventing or reducing breakage of the solder ball 7.

As described above, the shape of the solder ball 7 is defined by the aperture side surface 3hc of the aperture 3k2 of the solder resist film 3h, and occurrence of the inflection points is believed to cause breakage of the solder ball 7.

For this reason, in the semiconductor device 1 shown in FIG. 8, multiple conductor apertures 3pk1 are formed in the conductor pattern 3PL1. As shown in FIG. 10, the outline of an aperture 3k2 and a conductor aperture 3pk1 overlap with each other, in a plan view, respectively. In other words, as shown in FIG. 11, a side surface 3TLc of an exposed portion 3TL of the conductor pattern 3PL1 is exposed in the aperture 3k2. A side surface 3CPc of a covered portion 3CP of the conductor pattern 3PL1 is covered by the solder resist film 3h. In other words, part of the aperture side surface 3hc of the aperture 3k2 formed in the solder resist film 3h is disposed between a side surface 3TLc of the exposed portion 3TL of the conductor pattern 3PL1 and the side surface 3CPc of the covered portion 3CP.

While FIGS. 10 and 11 show the single aperture 3k2 in an enlarged manner, the example of FIG. 8 shows that the outlines of the multiple (four in FIG. 8) apertures 3k2 and the multiple (four in FIG. 8) conductor apertures 3pk1 overlap with each other, in a plan view, respectively. That is, the side surfaces 3TLc of the multiple (four in FIG. 8) exposed portions 3TL of the conductor pattern 3PL1 is exposed through inside the multiple (four in FIG. 8) apertures 3k2.

As shown in FIG. 11, the core layer (insulating layer, insulating underlayer) 3e formed over the conductor pattern 3PL1 is exposed in (the bottom surface of) the conductor aperture 3pk1. In other words, the conductor aperture 3pk1 is formed in such a manner that the conductor aperture 3pk1 penetrates through the conductor pattern 3PL1 in the thickness direction. In other words, a space region including no conductor is disposed between the aperture side surface 3hc of the solder resist film 3h and the side surface 3TLc of the exposed portion 3TL of the conductor pattern 3PL1.

The solder material of which the solder balls 7 are comprised has a characteristic of spreading in a wet manner along the exposed surface of an activated metal member when joined to another metal. For this reason, as shown in FIG. 11, the side surface 3TLc of the exposed portion 3TL of the conductor pattern 3PL1 and the outline of the aperture 3k2 (the aperture side surface 3hc of the solder resist film 3h) are separated from each other. Thus, the solder ball 7 does not easily contact the solder resist film 3h. That is, the present embodiment employs an NSMD structure, where the shape of the solder ball 7 is not defined by the aperture 3k2 of the solder resist film 3h. Thus, occurrence of inflection points, which may cause breakage of the solder ball 7, is reduced.

For example, in a semiconductor device 1B serving as a modification shown in FIG. 12, the exposed portion 3TL of the conductor pattern 3PL1 is separated from the covered portion 3CP of the conductor pattern 3PL1, which is covered by the solder resist film 3h. For this reason, the entire outline of the aperture 3k2 and the conductor aperture 3pk1 overlaps each other in a plan view. In this case, the entire side surface 3TLc of the exposed portion 3TL is disposed as separated from the aperture side surface 3hc of the solder resist film 3h.

The modification shown in FIG. 12 is a mode which is particularly preferable in preventing inflection points from easily occurring on the solder ball 7.

Alternatively, as shown in FIG. 10, part of the exposed portion 3TL of the conductor pattern 3PL1 may be connected with the covered portion 3CP of the conductor pattern 3PL1. In this case, as shown in FIG. 10, the aperture 3k2 has, in part of outline thereof, a region (SMD-structure region) 3smd where the exposed portion 3TL of the conductor pattern 3PL1 and the aperture side surface 3hc of the aperture 3k2 overlap with each other, respectively. On the other hand, a region 3nsmd of the aperture 3k2 other than the region 3smd is a region where the exposed portion 3TL of the conductor pattern 3PL1 and the aperture side surface 3hc of the aperture 3k2 do not overlap with each other, respectively (NSMD-structure region).

To prevent inflection points from easily occurring on the solder ball 7, it is preferred to make the length of the region 3smd shorter. For example, in the present embodiment, the length (arc length) W1 of the region 3smd of the aperture 3k2 shown in FIG. 10 is the same as the length (arc length) W2 of the region 3smd of an aperture 3k1 for a land 10 shown in FIG. 13.

As shown in FIG. 13, the aperture 3k1, formed to expose the land 10, has a region 3nsmd where the land 10 and the aperture side surface 3hc of the aperture 3k1 do not overlap each other (NSMD structure-region). Note that the land 10, which is a portion exposed from the solder resist film 3h, is electrically connected with the inter-layer conductor 3th (wire 3r) through a lead wire 10W, which is a portion covered by the solder resist film 3h. For this reason, part of the boundary between the land 10 and the lead wire 10W is covered by the solder resist film 3h. That is, the aperture 3kl has the region 3smd, where the land 10 and the aperture side surface 3hc of the aperture 3kl overlap each other (SMD structure-region).

Orientation of Exposed Portion of Conductor Pattern

Figure 14:
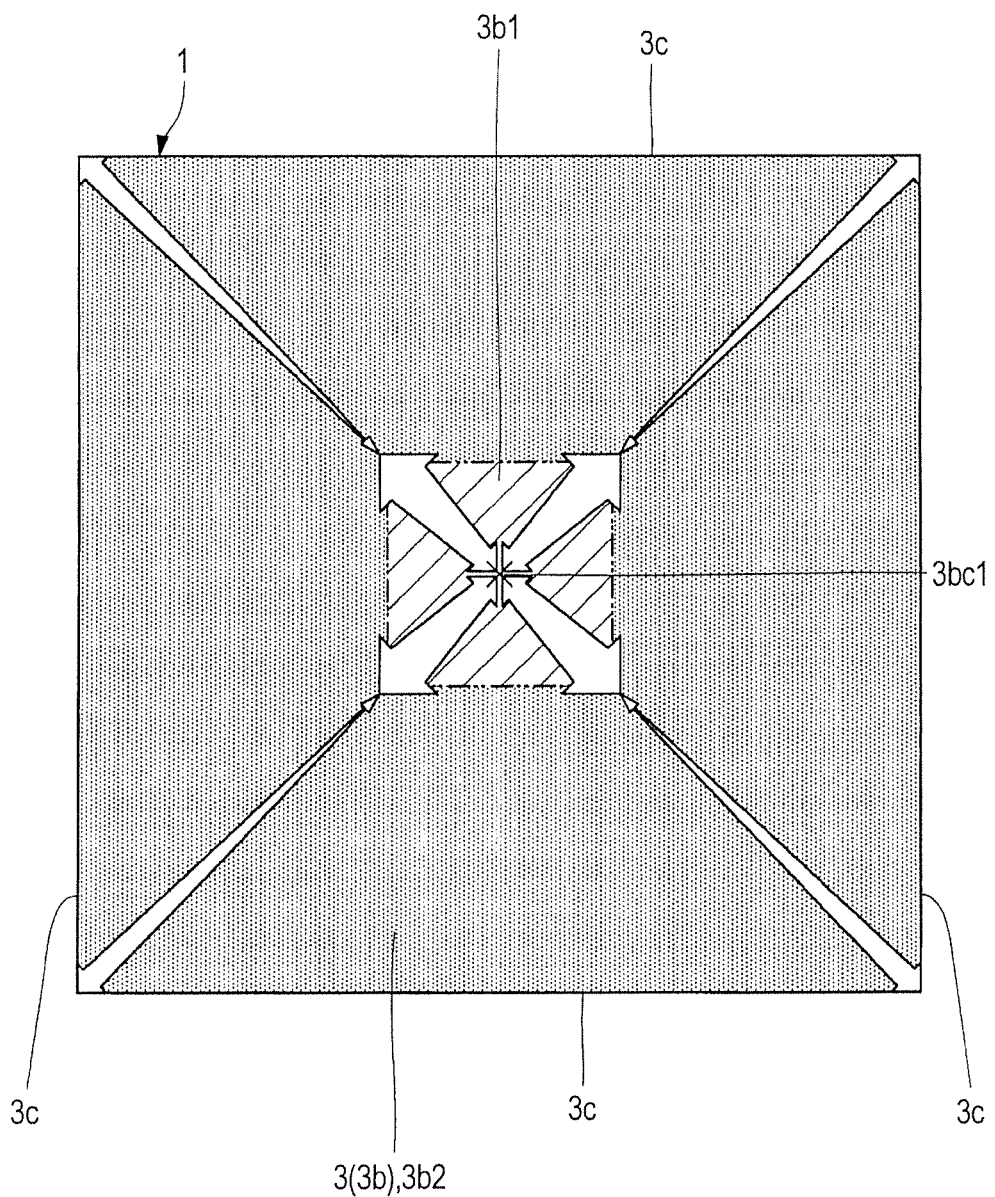
FIG. 14 is an explanation diagram schematically showing stress distribution over the mounting surface of the wiring board shown in FIG. 5 when temperature cyclic loading is applied.

Next, the orientation of the exposed portion 3TL of the conductor pattern 3PL1 shown in FIGS. 10 and 11 will be described. FIG. 14 is an explanation diagram schematically showing the distribution of stress over the mounting surface of the wiring board shown in FIG. 5 when temperature cyclic loading is applied. In FIG. 14, the directions in which stress acts are represented by arrows, and the magnitude of the stress is represented by the thicknesses of the arrows. To easily distinguish the region 3b1 and 3b2 from each other, the region 3b1 and the region 3b2 are represented by diagonal hatching and a dot pattern, respectively, in FIG. 14. For better viewability, the apertures 3k1 and 3k2, the lands 10, and the conductor pattern 3PL1 shown in FIG. 5 are omitted in FIG. 14.

As described above, to prevent inflection points from easily occurring on the solder ball 7, it is preferred to separate the exposed portion 3TL of the conductor pattern 3PL1 from the covered portion 3CP, covered by the solder resist film 3h, to separate the entire circumference of the exposed portion 3TL from the outline of the aperture 3k2, as seen in the modification shown in FIG. 12. Unless the solder ball 7 and the solder resist film 3h contact each other, inflection points are unlikely to occur on the solder ball 7.

However, in the modification shown in FIG. 12, the exposed portion 3TL and the covered portion 3CP are separated from each other. For this reason, an insulating material exists on the heat dissipation path coupling the exposed portion 3TL and the covered portion 3CP. To stably improve the heat dissipation characteristics, it is preferred to place a conductor material on the heat dissipation path. In positions very close to the semiconductor chip 2 acting as a heat source, such as the upper surface 3a of the wiring board 3 shown in FIG. 4, the heat dissipation characteristics are unlikely to degrade, even if an insulating material exists on the heat dissipation path. On the other hand, in positions distant from the heat source, such as the lower surface 3b of the wiring board 3, it is particularly preferred to place a conductor material. For this reason, as shown in FIG. 10, it is preferred to couple the exposed portion 3TL and covered portion 3CP of the conductor pattern 3PL1 through a conductor material to obtain the heat dissipation path 3HP (see FIG. 7), on which the conductor material is placed.

If the exposed portions 3TL and the covered portion 3CP of the conductor pattern 3PL1 are coupled together, the aperture 3k2 has, in part of the outline thereof, the region 3smd, where the exposed portion 3TL of the conductor pattern 3PL1 and the aperture side surface 3hc of the apertures 3k2 overlap each other (SMD-structure region), as shown in FIG. 10. For this reason, it is important to prevent the solder ball 7 shown in FIG. 11 from becoming cracked in the region 3smd to prevent breakage of the solder ball 7.

As shown in FIG. 7, when temperature cyclic loading is applied to the semiconductor device 1 mounted over the mounting substrate 20, stress occurs in the semiconductor device 1. This is because the semiconductor device 1 and the mounting substrate 20 have different linear expansion coefficients. Hereafter, the semiconductor chip 2 and the wiring board 3 of the semiconductor device 1 will be considered separately. The wiring board 3 and the mounting substrate 20 are each comprised of an insulating material and a conductor pattern. Accordingly, both are comprised of similar materials. On the other hand, the semiconductor chip 2 is comprised of a semiconductor material, such as silicon (Si), and has a smaller linear expansion coefficient than the constituent material of the wiring board 3 or mounting substrate 20.

When there is a large difference in linear expansion coefficient between the semiconductor chip 2 and the mounting substrate 20, such a large difference in linear expansion coefficient is believed to principally determine the magnitude of stress which occurs in the junction between the wiring board 3 and the mounting substrate 20. Even when the wiring board 3 and the mounting substrate 20 have similar linear expansion coefficients, the effect of the semiconductor chip 2, closely fixed to the wiring board 3, interferes with thermal expansion or contraction of the wiring board 3. Thermal expansion or contraction of the wiring board 3 is easily interfered with particularly in the region 3b1, overlapped by the semiconductor chip 2 in the thickness direction, of the lower surface 3b of the wiring board 3. As shown in FIG. 7, if the conductor pattern 3PL2 for transmitting heat to the conductor pattern 3PL1 is formed adjacent to the upper surface 3a of the wiring board 3 and if the conductor pattern 3PL1 and the conductor pattern 3PL2 are coupled together through the inter-layer conductors 3th (heat dissipation conductors 3t), the region overlapped by the semiconductor chip 2, of the wiring board 3 has large rigidity. For this reason, the semiconductor device 1 shown in FIG. 7 is more susceptible to the linear expansion coefficient of the semiconductor chip 2 than the semiconductor device 1A shown in FIG. 9.

Thus, as shown in FIG. 14, larger stress occurs in positions which are more distant from the center 3bc1, inside the region 3b1, overlapped by the semiconductor chip 2 (see FIG. 7) in the thickness direction, of the lower surface 3b of the wiring board 3. The value of stress is maximized around the peripheries of the region 3b1. On the other hand, the region 3b2 surrounding the region 3bl (the region not overlapped by the semiconductor chip 2 in the thickness direction) is unsusceptible to the linear expansion coefficient of the semiconductor chip 2. Accordingly, smaller stress occurs in the region 3b2 than in the region 3b1. In the region 3b2, stress occurs due mainly to the difference in linear expansion coefficient between the wiring board 3 and the mounting substrate 20 (see FIG. 7). Accordingly, larger stress occurs in positions which are more distant from the center of the wiring board 3. Note that the positions around the boundaries between the regions 3b1 and 3b2 may be affected by the linear expansion coefficient of the semiconductor chip 2.

If stress which occurs when temperature cyclic loading is applied is distributed as shown in FIG. 14, the stress tends to be concentrated on the solder balls 7 disposed in the region 3bl of the solder balls 7 shown in FIG. 7. In other words, the solder balls 7 connected with the conductor pattern 3PL1 particularly tend to be broken.

Further, the inventors have examined the positions of cracks in each solder ball 7. The examination has revealed that stress tends to be concentrated on the positions which are most distant from the center 3bc1 of the region 3b1 (see FIG. 8), of the solder ball 7 shown in FIG. 11. That is, stress tends to be concentrated on the junction interface between the solder ball 7 and the exposed portion 3TL at the intersection of the virtual straight line VL1 (see FIG. 10), which links the center 3bc1 and the center 3bc2 of the aperture 3k2, and the side surface 3TLc of the exposed portion 3TL of the conductor pattern 3PL1.

In the case where the solder ball 7 is broken due to stress concentration, breakage occurs in the positions on which stress most likely tends to be concentrated, of the solder ball 7. For this reason, if breakage in the positions on which stress tends to be concentrated is prevented or reduced, breakage is unlikely to occur in other positions of the solder ball 7. Accordingly, if breakage of the solder ball 7 is prevented or reduced at the intersection of the virtual straight line VL1 (see FIG. 10), which links the center 3bc1 of the region 3b1 (see FIG. 8) and the center 3bc2 of the aperture 3k2, and the side surface 3TLc of the exposed portion 3TL in the present embodiment, breakage in other positions of the solder ball 7 can also be prevented or reduced.

For this reason, in the present embodiment, as shown in FIG. 10, by employing an NSMD structure in the position on which stress particularly tends to be concentrated, of the aperture 3k2, breakage of the solder ball 7 (see FIG. 11) is prevented or reduced. Specifically, as shown in FIG. 10, the conductor pattern 3PL1 (the boundary between the exposed portion 3TL and the covered portion 3CP) is disposed at an intersection (virtual point) VP1 adjacent to the center 3bc1 of the region 3b1, of the intersections of the virtual straight line VL1 and the aperture 3k2. On the other hand, the conductor aperture 3pk1 is disposed at an intersection (virtual point) VP2 distant from the center 3bc1 of the region 3b1, of the intersections of the virtual straight line VL1 and the aperture 3k2. The virtual straight line VL1 shown in FIG. 10 is a straight line passing through the center 3bc1 of the region 3b1 (see FIG. 8), overlapped by the semiconductor chip 2 (see FIG. 7) in the thickness direction, and the center 3bc2 of the aperture 3k2.

According to the present embodiment, as shown in FIG. 11, there is employed the NSMD structure, where the solder ball 7 and the solder resist film 3h are unlikely to contact each other at the intersection VP2. Thus, breakage in the positions on which stress tends to be concentrated, of the solder ball 7 can be prevented or reduced. On the other hand, in the region 3smd, which employs an SMD structure, the solder ball 7 and the solder resist film 3h contact each other. Accordingly, an inflection point tends to be formed on the solder ball 7 at the intersection VP1. However, stress is unlikely to be concentrated on the region around the intersection VP1. Accordingly, in such a region, the solder ball 7 is unlikely to be broken.

That is, according to the present embodiment, breakage of the solder balls 7 can be prevented or reduced in the region 3b1 (see FIG. 8), where the solder balls 7 particularly tend to be broken. As a result, it is possible to improve the coupling reliability between the semiconductor device 1 (conductor pattern 3PL1) and the mounting substrate 20 shown in FIG. 7. Further, it is possible to stabilize the heat dissipation characteristics of the heat dissipation paths 3HP coupling the conductor pattern 3PL1 and the heat dissipation terminals 21b of the mounting substrate 20. If heat dissipation characteristics of the heat dissipation paths 3HP formed in the semiconductor device 1 is stabilized, the temperature of the semiconductor device 1 in operation is stabilized. As a result, the operation reliability of the semiconductor device 1 can be improved.

Preferred Mode

While some of the features of the semiconductor device 1 according to the present embodiment have been described above, a preferred mode will be further described below.

As shown in FIG. 6, the lands 10 are formed integrally with the lead wires 10W formed toward the inter-layer conductors (inter-layer conductive paths) 3th (wires 3r), which electrically couple the upper surface 3a (see FIG. 4) serving as the chip mounting surface and the lower surface 3b serving as the mounting surface.

The lands 10 are formed in a region different from the region 3b1. In other words, the lands 10 are formed in a region which is not overlapped by the semiconductor chip 2 shown in FIG. 4 in the thickness direction. In an example shown in FIG. 6, the region 3b2 is formed around the region 3b1, overlapped by the semiconductor chip 2 (see FIG. 4) in the thickness direction (for the boundaries between the regions 3b1 and 3b2, see FIG. 14), and the lands 10 are disposed in the region 3b2, which is not overlapped by the semiconductor chip 2.

As shown in FIG. 14, smaller stress occurs in the region 3b2 than in the region 3b1. For this reason, the solder balls 7 disposed in the region 3b2 are less likely to be broken than the solder balls 7 disposed in the region 3b1. Accordingly, when disposing the lands 10 in the region 3b2, the orientations of the lead wires 10W formed integrally with the lands 10 may be determined considering the ease of wire routing. For example, if the lands 10 and the conductor pattern 3PL1 shown in FIG. 6 are formed by electroplating, feeder lines (not shown) need to be drawn in addition to the conductor pattern (including the lands 10 and the lead wires 10W) shown in FIG. 6.

In the example shown in FIG. 6, the lands 10 include lands 10a which are disposed integrally with lead wires 10W disposed toward the peripheries of the lower surface 3b. The lands 10 also include lands 10b which are disposed integrally with lead wires 10W disposed toward the region 3b1 over the lower surface 3b. In other words, the lands 10a are disposed between the inter-layer conductors 3th, to which the lands 10a are coupled, and the region 3b1. The inter-layer conductors 3th, to which the lands 10b are coupled, are disposed between the land 10b and the region 3b1. In other words, in the example shown in FIG. 6, there are disposed both the lands 10a, whose lead wires 10W are disposed toward the peripheries of the lower surface 3b, and the lands 10b, whose lead wires 10W are disposed toward the center (region 3b1) of the lower surface 3b. As seen above, by disposing the lands 10 in the region 3b2, which is not overlapped by the semiconductor chip 2 (see FIG. 4), the flexibility of wiring design can be increased.

In the example shown in FIG. 6, the lead wires 10W of half or more of the outermost lands 10 over the lower surface 3b of the lands 10, which are disposed in a matrix form, are disposed toward the peripheries of the lower surface 3b. In other words, half or more of the outermost lands 10 over the lower surface 3b are the lands 10. In this case, the region between the outermost lands 10 and the side surface 3c of the wiring board 3 may be used as space for disposing wires (for example, the wires 3r for electrically coupling the semiconductor chip 2 and the lands 10 shown in FIG. 4). Thus, the mounting area of the wiring board 3 can be reduced.

Note that while smaller stress occurs in the region 3b2 than in the region 3b1 as shown in FIG. 14, stress itself occurs in the region 3b2. Further, the effect of the linear expansion coefficient of the semiconductor chip 2 may cause stress in positions around the boundaries between the regions 3b1 and 3b2, of the region 3b2. For this reason, as shown in FIG. 8, it is preferred to dispose the lead wires 10W of the innermost lands 10 in the region 3b2 toward the center 3bc1 of the region 3b1. In this case, as described with reference to FIGS. 10 and 11, it is possible to prevent or reduce breakage of the solder balls 7 by employing an NSMD structure in the region on which stress tends to be concentrated. By preventing or reducing breakage of the solder balls 7 electrically connected with the semiconductor chip 2 (see FIG. 4), it is possible to improve the reliability of, the electrical coupling of the semiconductor device 1.

Figure 15:
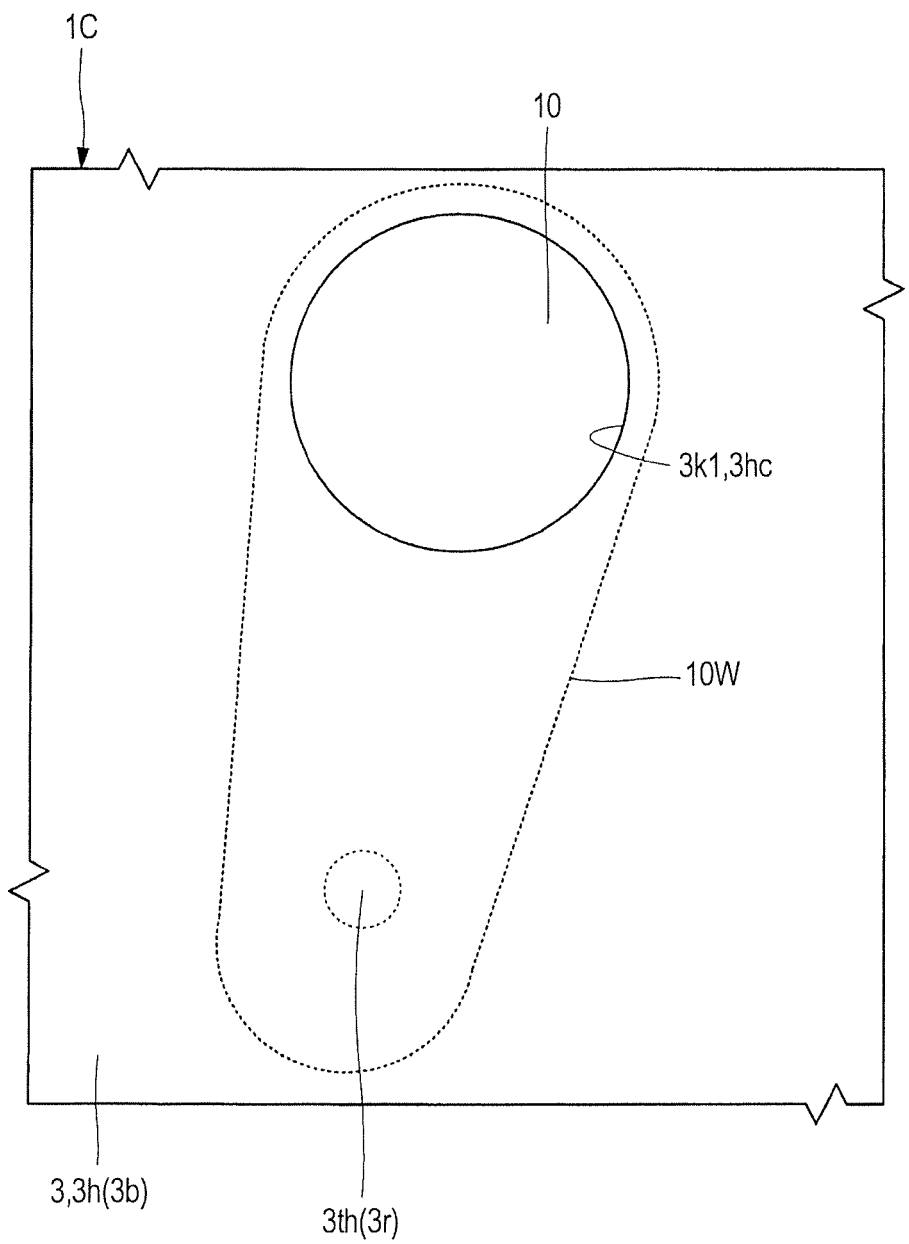
FIG. 15 is an enlarged plan view showing a modification to FIG. 13.

Further, by considering that smaller occurs in the region 3b2 than in the region 3b1 as shown in FIG. 14, there may be employed an SMD structure where the entire outline of an aperture 3k1 and a land 10 overlap each other, as seen in a semiconductor device 1c serving as a modification shown in FIG. 15. FIG. 15 is an enlarged plan view showing a modification to FIG. 13.

Note that when coupling the solder balls 7 and the terminals 21 serving as mounting terminals as shown in FIG. 7, it is preferred to limit the heights (coplanarity) of the solder balls 7 within a predetermined range to prevent some solder balls 7 from not being connected with the terminals 21. The predetermined range varies depending on the size of the solder balls 7 or the specification of the semiconductor device 1 or mounting substrate 20. Assuming that the solder balls 7 have the same volume and that the apertures 3k1 have the same diameter, the height of the solder balls 7 mounted over the lands 10 having an SMD structure is higher than that of the solder balls 7 mounted over the lands 10 having an NSMD structure. Accordingly, to make the heights of the solder balls 7 uniform, it is preferred to apply an NSMD structure as shown in FIG. 13 to each of the apertures 3k1 formed to expose the lands 10.

Specifically, in an example shown in FIG. 5, side surfaces 10c (see FIG. 13) of the lands 10 are exposed from the solder resist film 3h through the apertures 3k1. In other words, the side surfaces 10c (see FIG. 13) of the lands 10 and the aperture side surfaces 3hc of the solder resist film 3h are separated from each other in the apertures 3k1.

Further, as shown in FIG. 13, each land 10 has an exposed portion (land 10) exposed from the solder resist film 3h in a position which overlaps the aperture 3k1. Similarly, as shown in FIG. 10, the conductor pattern 3PL1 has an exposed portion 3TL exposed from the solder resist film 3h in a position which overlaps an aperture 3k2. The exposed area of each land 10 is the same as that of each exposed portion 3TL of the conductor pattern 3PL1. The height of each solder ball 7 varies depending on the contact area between the solder ball 7 and a metal member to which the solder ball 7 is joined. Accordingly, by making the exposed area of each land 10 and that of each exposed portion 3TL of the conductor pattern 3PL1 equal to each other, it is possible to make the heights of the solder balls 7 uniform.

As seen from a comparison between FIGS. 10 and 13, in the present embodiment, the land (exposed portion) 10 shown in FIG. 13 and the exposed portion 3TL of the conductor pattern 3PL1 shown in FIG. 10 have the same shape. Thus, it is possible to make the heights of the solder balls 7 uniform more accurately.

Figure 16:
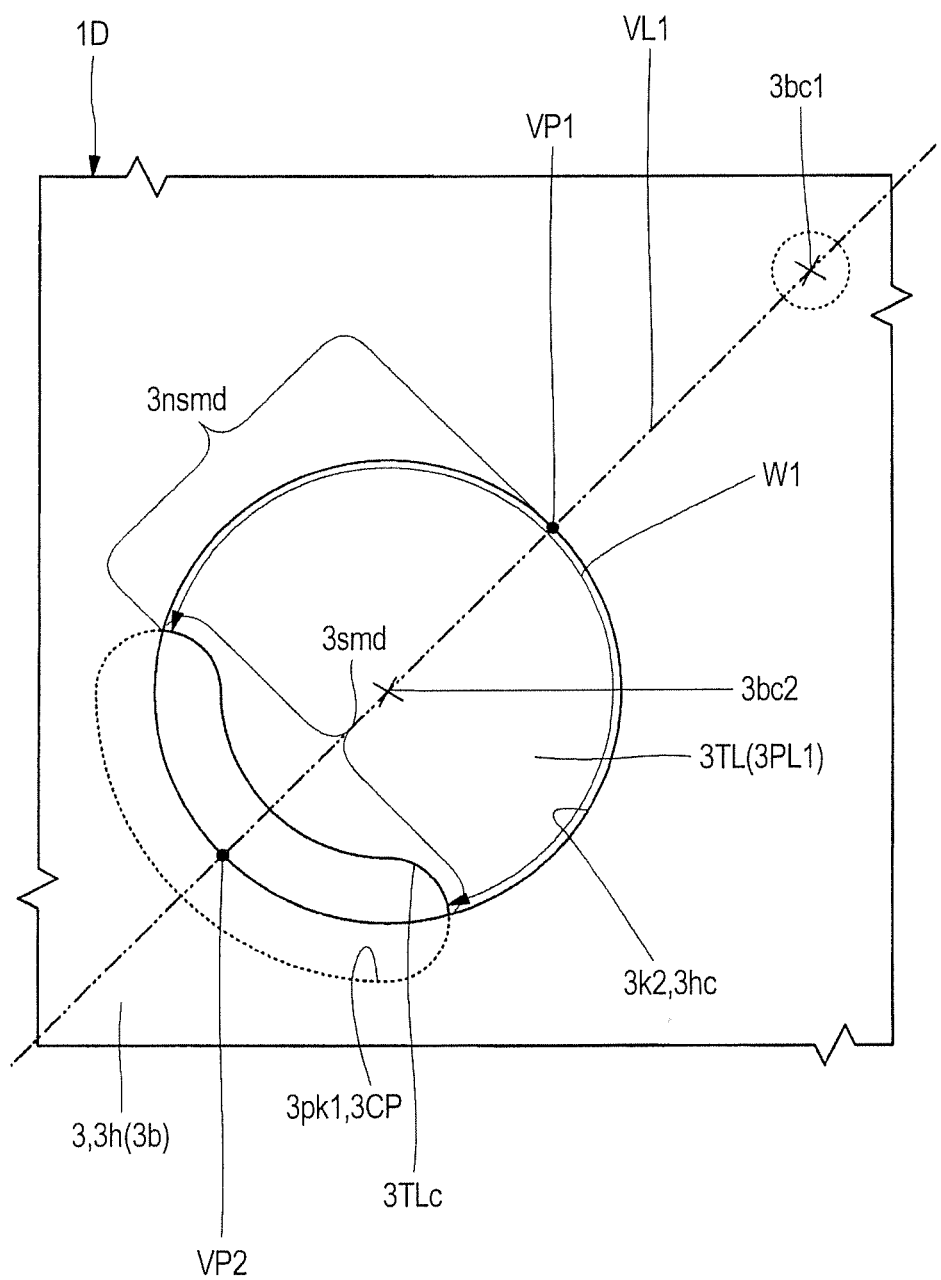
FIG. 16 is an enlarged plan view showing another modification to FIG. 10.
Figure 17:
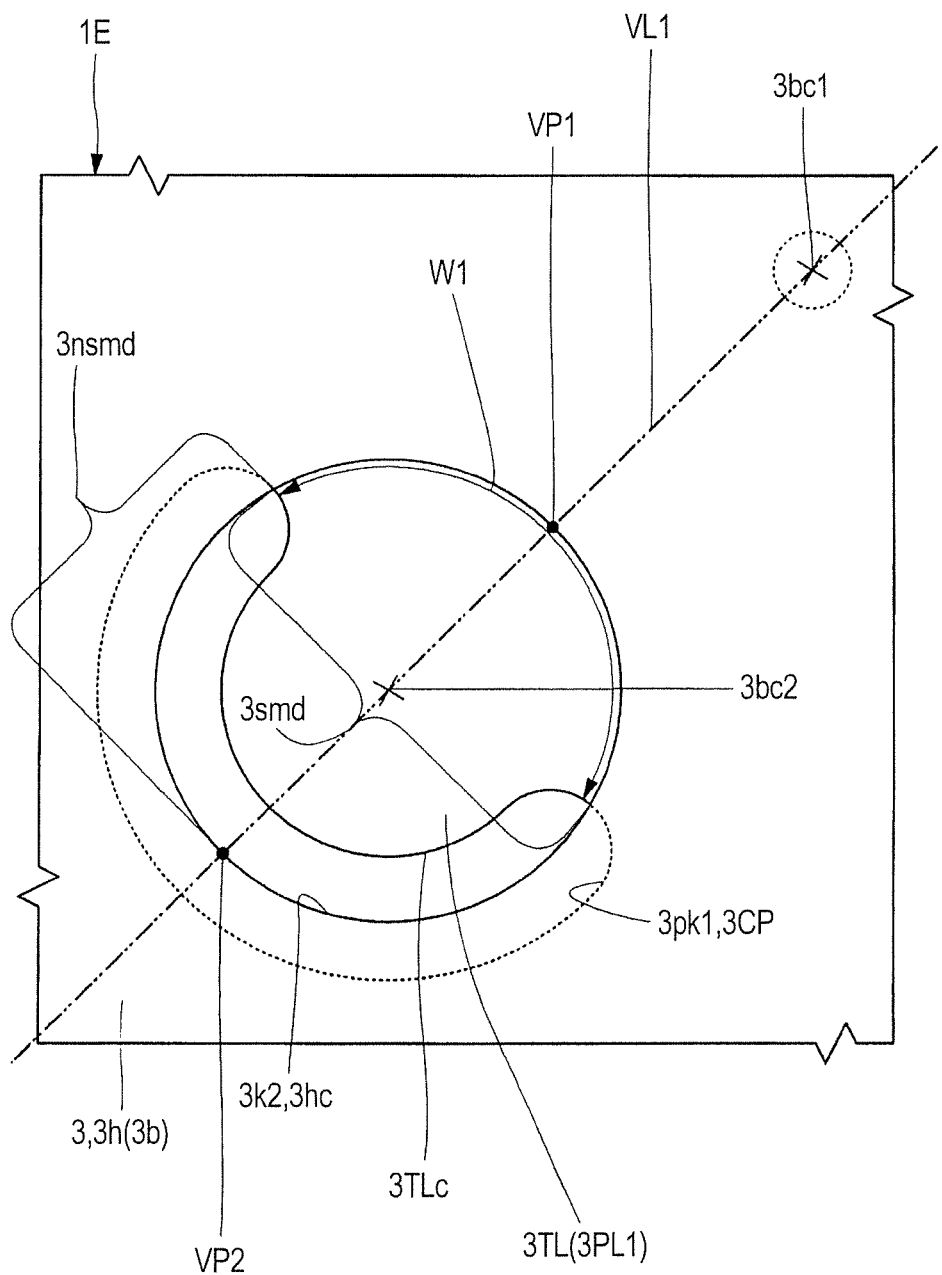
FIG. 17 is an enlarged plan view showing yet another modification to FIG. 10.

To improve the heat dissipation characteristics of the heat dissipation paths 3HP shown in FIG. 7, it is preferred to increase the sectional area in each heat dissipation path 3HP. If a conductor aperture 3pk1 is formed in the conductor pattern 3PL1 as shown in FIG. 10, the conductor aperture 3pk1 is unlikely to make a contribution to the heat dissipation path 3HP (see FIG. 7). Accordingly, to improve the heat dissipation characteristics, it is preferred to reduce the area of each conductor aperture 3pk1 to the extent that breakage of the solder balls 7 (see FIG. 7) can be reduced. FIGS. 16 and 17 are enlarged plan views showing modifications to FIG. 10.

First, in an example shown in FIG. 10, the area of the conductor aperture 3pk1 is smaller than the area of the aperture 3k2 which overlaps the conductor aperture 3pk1. The conductor aperture 3pk1 is formed in such a manner that the conductor aperture 3pk1 extends along the outline (aperture side surface 3hc) of the aperture 3k2. In the example shown in FIG. 10, the conductor aperture 3pk1 formed along the outline of the aperture 3k2 forming a circle has a U-shape or C-shape. Since the conductor aperture 3pk1 is formed in such a manner that the conductor aperture 3pk1 extends along the outline of the aperture 3k2, it is possible to reduce the area of the conductor aperture 3pk1 and to effectively reduce breakage of the solder balls 7 (see FIG. 7).

The position having the smallest sectional area on each heat dissipation path 3HP shown in FIG. 7 is the boundary between the exposed portion 3TL and the covered portion 3CP shown in FIG. 10. Accordingly, by increasing the length (arc length) W1 of the region 3smd shown in FIG. 10, the heat dissipation efficiency can be improved. If a conductor aperture 3pk1 overlaps at least one-fourth the outline (aperture side surface 3hc) of an aperture 3k2, as seen in a semiconductor device 1D serving as a modification shown in FIG. 16, it is possible to apply an NSMD structure to the intersection VP2, on which stress most likely tends to be concentrated, although an error may occur in stress distribution or processing accuracy. As a result, the semiconductor device 1D shown in FIG. 16 can exhibit higher heat dissipation efficiency than the semiconductor device 1 shown in FIG. 10.

Further, to improve heat dissipation efficiency as well as to make the exposed area or shape of the exposed portion 3TL close to that of the land 10 shown in FIG. 13, it is preferred to make a conductor aperture 3pk1 overlap half or more the outline (aperture side surface 3hc) of an aperture 3k2, as seen in a semiconductor device 1E shown in FIG. 17.

As described above, the examination of the positions of the cracks which have occurred in the solder balls 7 has revealed that stress tends to be concentrated on the position which is most distant from the center 3bc1, of the solder ball 7 shown in FIG. 11. That is, stress tends to be concentrated on the junction interface between the solder ball 7 and the exposed portion 3TL at the intersection of the virtual straight line VL1 (see FIG. 10), which links the center 3bc1 and the center 3bc2 of the aperture 3k2, and the side surface 3TLc of the exposed portion 3TL of the conductor pattern 3PL1. Accordingly, by improving the junction strength between the solder ball 7 and the conductor pattern 3PL1 in the position on which stress tends to be concentrated, it is possible to further improve the coupling reliability of the solder ball 7.

Figure 18:
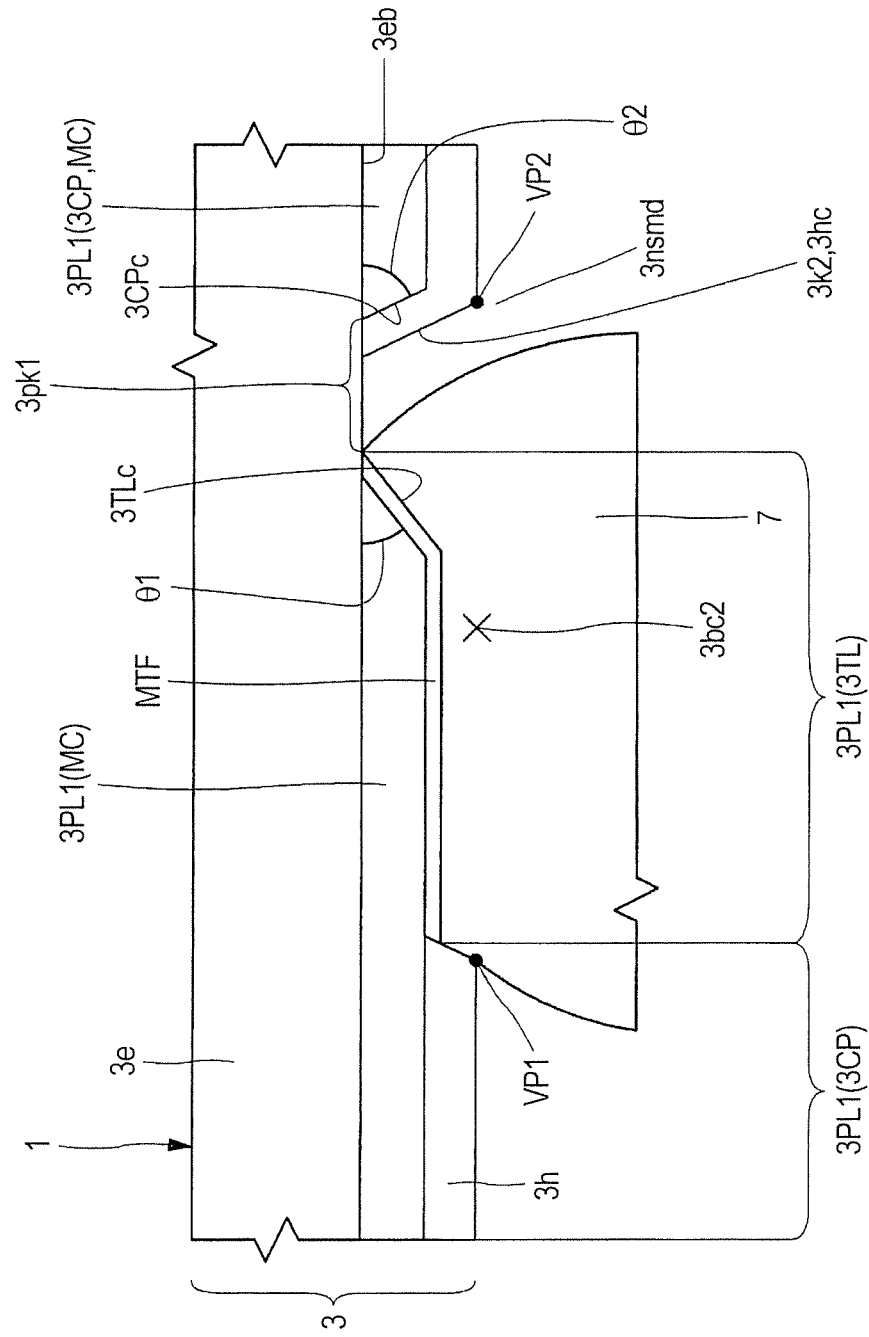
FIG. 18 is a further enlarged sectional view of the vicinity of an aperture shown in FIG. 11.

In the present embodiment, as shown in FIG. 18, an angle θ1 formed by a lower surface (undersurface) 3eb of the core layer 3e serving as an insulating underlayer under which the conductor pattern 3PL1 is formed and the side surface 3TLc of the exposed portion 3TL is smaller than an angle 82 formed by the lower surface 3eb and the side surface 3CPc of the covered portion 3CP. FIG. 18 is a further enlarged sectional view of the vicinity of the aperture shown in FIG. 11. While FIG. 18 is a sectional view, it omits the hatching shown in FIG. 11 for better viewability of the angles θ1 and θ2.

Since the angle ϵ1 is smaller than the angle 82 as seen in FIG. 18, the length of the side surface 3TLc of the exposed portion 3TL is longer than that of the side surface 3CPc of the covered portion 3CP. Thus, the junction area between the side surface 3TLc and the solder ball 7 can be increased. By increasing the junction area between the side surface 3TLc and the solder ball 7, it is possible to increase the junction strength between the solder ball 7 and the conductor pattern 3PL1 in the position on which stress most likely tends to be concentrated. A structure in which the angle θ1 is smaller than the angle 82, as shown in FIG. 18, can be formed by, in the process of manufacturing the wiring board 3, forming the aperture 3k2 in the solder resist film 3h, exposing part of the conductor aperture 3pk1, and then performing, e.g., etching.

In examples shown in FIGS. 11 and 18, a metal film MTF having higher wettability with respect to the solder ball 7 than a metal member MC serving as a substrate is formed under the exposed surface (the surface exposed from the solder resist film 3h) of the exposed portion 3TL of the conductor pattern 3PL1 in such a manner that the metal film MTF covers the metal member MC. In the examples shown in FIGS. 11 and 18, the metal member MC is comprised of, e.g., copper (Cu), and the metal film MTF covering the metal member MC includes, e.g., nickel (Ni). Note that a gold (Au) film is also formed over a surface of a nickel film serving as the metal film MTF in the process of manufacturing the semiconductor device 1. The components of the gold (Au) film tend to disperse into the solder balls 7. For this reason, after joining the solder balls 7, the nickel film including nickel (Ni) as a main component serves as the metal film MTF.

By forming, under the surface of the exposed portion 3TL, the metal film MTF having higher wettability with respect to the solder balls 7 than the metal member MC serving as a substrate as seen above, the exposed portion 3TL of the conductor pattern 3PL1 is easily activated when joining the solder balls 7. As a result, the solder ball 7 is less likely to contact the solder resist film 3h than in a case where the metal member MC is exposed, thereby allowing occurrence of inflection points to be reduced. Further, since the coupling strength between the solder ball 7 and the conductor pattern 3PL1 is increased, peel-off of the coupling interface between the solder ball 7 and the conductor pattern 3PL1 is unlikely to occur.

Figure 19:
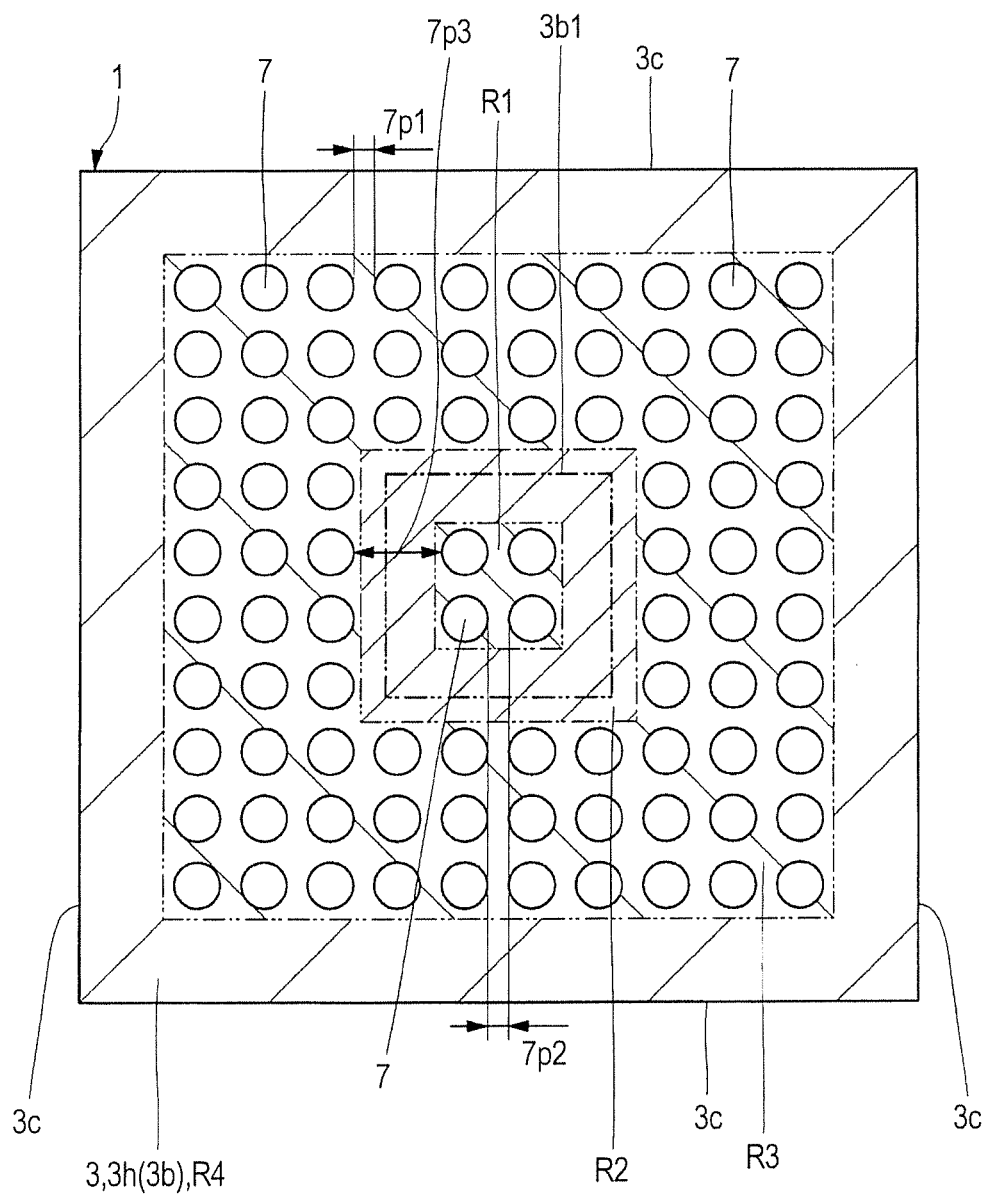
FIG. 19 is a plan view showing the mounting surface of the wiring board shown in FIG. 2.

As described with reference to FIG. 14, largest stress occurs in the peripheries of the region 3b1, overlapped by the semiconductor chip 2 (see FIG. 7) in the thickness direction, of the lower surface 3b of the wiring board 3. Accordingly, it is preferred not to dispose solder balls 7 in the position which overlaps the outline of the region 3b1. In other words, as shown in FIG. 19, it is preferred to cover the entire outline of the region 3b1 with the solder resist film 3h. FIG. 19 is a plan view showing the mounting surface of the wiring board shown in FIG. 2. Note that FIG. 19 is subjected to different types of hatching to distinguish among the regions of the lower surface 3b of the wiring board 3.

In an example shown in FIG. 19, the lower surface 3b of the wiring board 3 is divided into regions R1, including the center of the lower surface 3b, R2, R3, and R4. The region R1, which includes the center of the lower surface 3b, has solder balls 7 disposed therein. As shown in FIG. 7, the solder balls 7 disposed in the region R1 are connected with the conductor pattern 3PL1. That is, in the present embodiment, the solder balls 7 disposed in the region R1 are used as heat dissipation terminals (thermal balls).

Of the regions R2, R3, and R4 disposed around the region R1, the region R2 adjacent to the region R1 has no solder balls 7 therein and is covered by the solder resist film 3h. The entire outline of the region 3b1 is disposed in positions overlapping the region R2. That is, no solder balls 7 are disposed in the positions overlapping the outline of the region 3b1.

Solder balls 7 are disposed in the region R3, which is located outside the region R2 and adjacent to the region R2. The solder balls 7 disposed the region R3 are external terminals which are electrically connected with the semiconductor chip 2 shown in FIG. 4. The separation distance (disposition pitch) 7p1 among the solder balls 7 disposed in the region R3 is equal to the separation distance (disposition pitch) 7p2 among the solder balls 7 disposed in the region R1. Since the region R2 having no solder balls 7 therein exists between the regions R1 and R3, the shortest distance 7p3 between the solder balls 7 disposed in the region R1 and the solder balls 7 disposed in the region R3 is longer than the separation distances 7p1 and 7p2.

As seen above, by disposing the region R2 having no solder balls 7 therein between the region R3 having the solder balls 7 serving as electrode terminals therein and the region R1 having the solder balls 7 serving as heat dissipation terminals therein, there can be obtained a configuration where no solder balls 7 are disposed in the positions overlapping the outline of the region 3b1. As a result, it is possible to improve the heat dissipation efficiency and to prevent or reduce breakage of the solder balls 7.

The region R4, which is located outside the region R3 and adjacent to the region R3, is a region forming the peripheries of the lower surface 3b and has no solder balls 7 therein. In the present embodiment, by disposing the inter-layer conductors 3th (wires 3r, via wires, through-hole wire) (see FIG. 6) in the region R4, the flexibility of wiring design is increased as described above.

Method for Manufacturing Semiconductor Device

Figure 20:
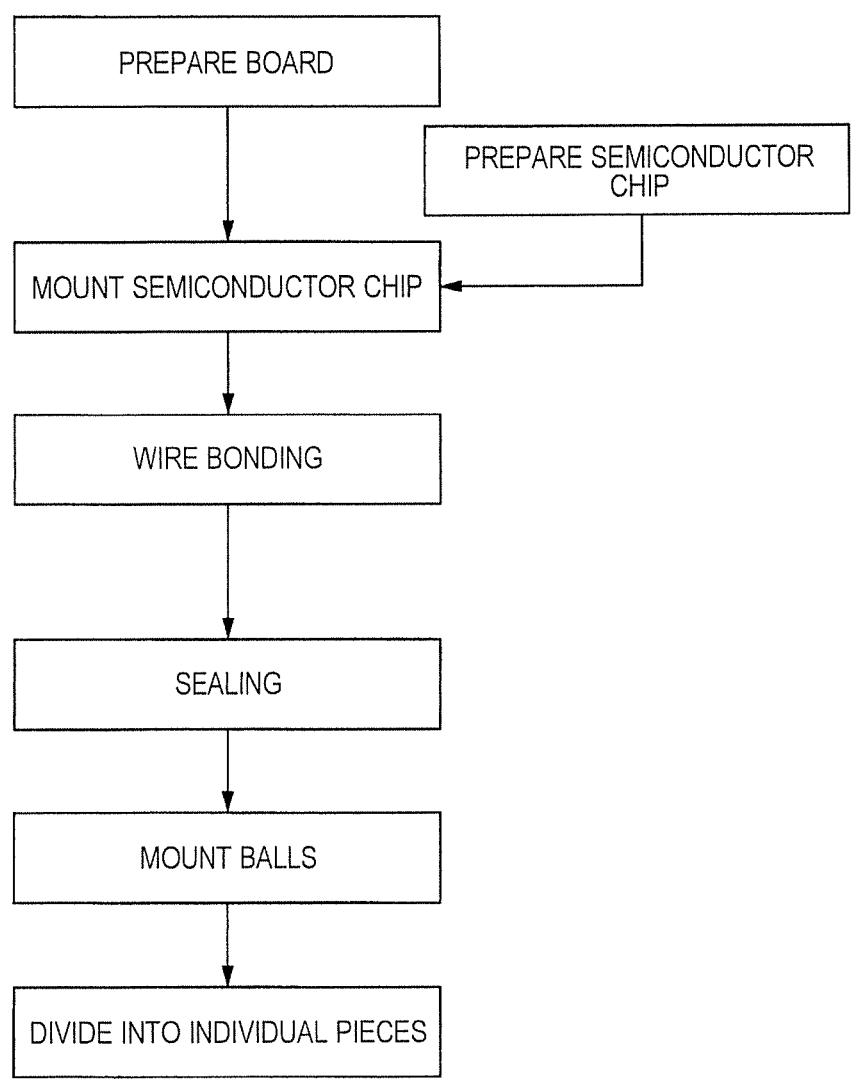
FIG. 20 is an explanation diagram showing the flow of the assembly process of the semiconductor device described with reference to FIGS. 1 to 19.
Figure 21:
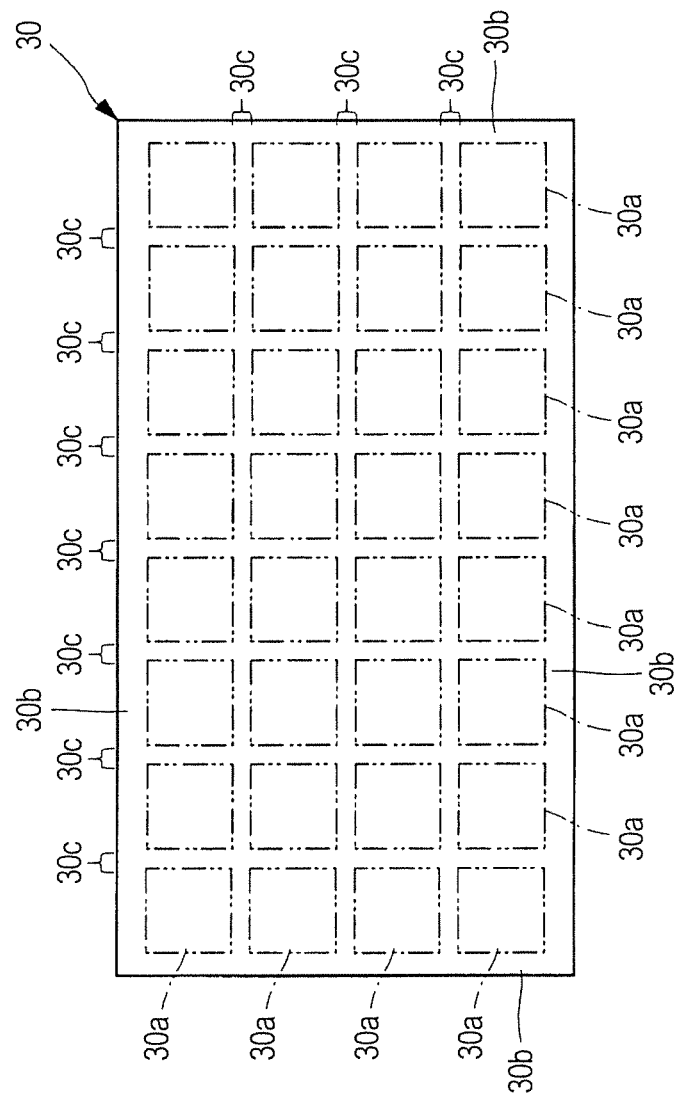
FIG. 21 is a plan view showing the overall structure of a wiring board prepared in a board preparation step shown in FIG. 20.

Next, a manufacturing method (assembly process) of the semiconductor device 1 described with reference to FIGS. 1 to 19 will be described with reference to a flowchart shown in FIG. 20. FIG. 20 is an explanation diagram showing the flow of the assembly process of the semiconductor device described with reference to FIGS. 1 to 19. FIG. 21 is a plan view showing the overall structure of a wiring board prepared in a board preparation step shown in FIG. 20. In the following description, there will be described a manufacturing method of preparing a so-called multiple substrate, where multiple device regions corresponding to the wiring board 3 shown in FIG. 1 are disposed, and making assembly for each of the device regions. Since each of multiple device regions 30a shown in FIG. 21 corresponds to the wiring board 3 described with reference to FIGS. 1 to 19, FIGS. 1 to 19 will be referred to in the following description, as necessary.

First, in the board preparation step shown in FIG. 20, for example, a wiring board 30 shown in FIG. 21 is prepared. As shown in FIG. 21, the wiring board 30 prepared in this step has multiple device regions 30a inside a frame (external frame) 30b. Specifically, the multiple (32 in FIG. 21) device regions 30a are disposed in a matrix form. The device regions 30a each correspond to the wiring board 3 shown in FIGS. 1 to 6. The wiring board 30 is a so-called multiple board, which has the multiple device regions 30a and dicing lines (dicing regions) 30c between the device regions 30a. As seen above, by using the multiple substrate having the device regions 30a, the manufacturing efficiency can be improved.

In the wiring board 30 prepared in this step, the components described with reference to FIGS. 1 to 19 are previously formed except that the semiconductor chip 2 shown in FIG. 4 has yet to be mounted, that the multiple wires 6 and solder balls 7 have yet to be coupled together, and that the sealing body 4 has yet to be formed. For this reason, the components will not be described repeatedly.

In a semiconductor chip preparation step, the semiconductor chip 2 shown in FIG. 4 is prepared. An insulating film covering the substrate and wires of the semiconductor chip 2 is formed over the front surface 2a of the semiconductor chip 2. The front surfaces of the pads PD are exposed from the insulating film through apertures formed in the insulating film. The pads PD are comprised of a metal and, in the present embodiment, are comprised of, e.g., aluminum (Al).

In a semiconductor chip mounting step, as shown in FIG. 4, the semiconductor chip 2 is mounted over the upper surface 3a serving as the chip mounting surface of the wiring board 30 (see FIG. 21). In this step, the semiconductor chip 2 is mounted over each of the device regions 30a shown in FIG. 21. In the present embodiment, as shown in FIG. 4, the semiconductor chip 2 is mounted over each device region 30a by so-called face-up mounting, in which the surface (back surface 2b) opposite to the front surface (principal surface) 2a over which the pads PDs are formed is opposed to the chip mounting surface (upper surface 3a). In this case, the semiconductor chip 2 can be mounted by bonding the die bonding material 5 to the back surface 2b of the semiconductor chip 2 in advance and then bonding the die bonding material 5 to the upper surface 3a.

In a wire bonding step, as shown in FIGS. 3 and 4, the pads PD exposed over the front surface 2a of the semiconductor chip 2 and the bonding leads 3d exposed over the upper surface 3a of the wiring board 30 (see FIG. 21) are electrically coupled together through the wires 6.

In a sealing step, as shown in FIG. 4, the sealing body 4 is formed by sealing the semiconductor chip 2 and wires 6 mounted over the wiring board 30 (see FIG. 21) using a resin. In the example shown in FIG. 4, the sealing body 4 is formed in such a manner that the sealing body 4 covers the entire wiring board 3. Although not shown, the device regions 30a for the wiring boards 30 shown in FIG. 21 are collectively covered by the single sealing body 4. Such a method of collectively covering the multiple device regions 30a using the single sealing body 4 is called mold array package (MAP). As a modification to the present embodiment, there may be employed a method (on-pack) of forming the sealing body 4 in such a manner that the sealing body 4 covers the semiconductor chip 2 and the wires 6 and to expose the peripheries of the wiring board 3 from the sealing body 4.

In a ball mounting step, the solder balls 7 are mounted over the lower surface 3b serving as the mounting surface of the wiring board 3. In this step, the solder balls 7 are mounted by disposing the solder balls 7 over the exposed portions 3TL exposed from the solder resist film 3h shown in FIG. 7 and over the lands 10 and then performing a reflow process (a process of heating the solder balls 7 to melt and join together solder components and then cooling the solder balls 7) on the solder balls 7.

In a divide-into-individual-pieces step, by cutting the wiring board 30 along the dicing lines partitioning the device regions 30a shown in FIG. 21, the wiring board 30 is divided into individual pieces corresponding to the device regions 30a. Thus, multiple semiconductor devices 1 (see FIG. 1) are obtained.

Subsequently, the semiconductor devices 1 are subjected to necessary checks or tests, such as an appearance check or electrical test, and then shipped or mounted over mounting substrates (not shown).

Other Modifications

While the present invention has been described in detail based on the embodiment, the invention is not limited thereto. Of course, various changes can be made to the embodiment without departing from the spirit and scope of the invention.

In the above embodiment, there has been described the semiconductor device 1 where the solder balls 7 are joined to the exposed portions 3TL of the conductor pattern 3PL1 and the lands 10. However, the above technology is also applicable to land grid array (LGA)-type semiconductor devices, over which the solder balls 7 shown in FIG. 4 are mounted and which are shipped with the exposed portions 3TL and the lands 10 exposed. When an LGS-type semiconductor device is mounted over, for example, a mounting substrate as shown in FIG. 7, a conductive coupling material, such as a solder material, is used to couple the terminals to each other. For this reason, the above technology can be effectively applied even to the LGA-type semiconductor device. With respect to the challenge of improving the uniformity (coplanarity) of the heights of the lowest points of the solder balls 7, the above technology is effectively applied to the BGS-type semiconductor device 1, which is shipped with the semiconductor device 1 having the solder balls 7 coupled thereto.

In the above embodiment, there has been described the mode in which the semiconductor chip 2 is mounted over the center of the wiring board 3. Accordingly, as shown in FIG. 8, the center 3bc3 of the lower surface 3b of the wiring board 3 and the center 3bc1 of the region 3b1 are matched. For this reason, the structure of the aperture 3k2 can be defined as follows by using the center of the lower surface of the wiring board shown in FIG. 8 as a reference and by referring to FIG. 22, which is an enlarged plan view similar to FIG. 10.

Figure 22:
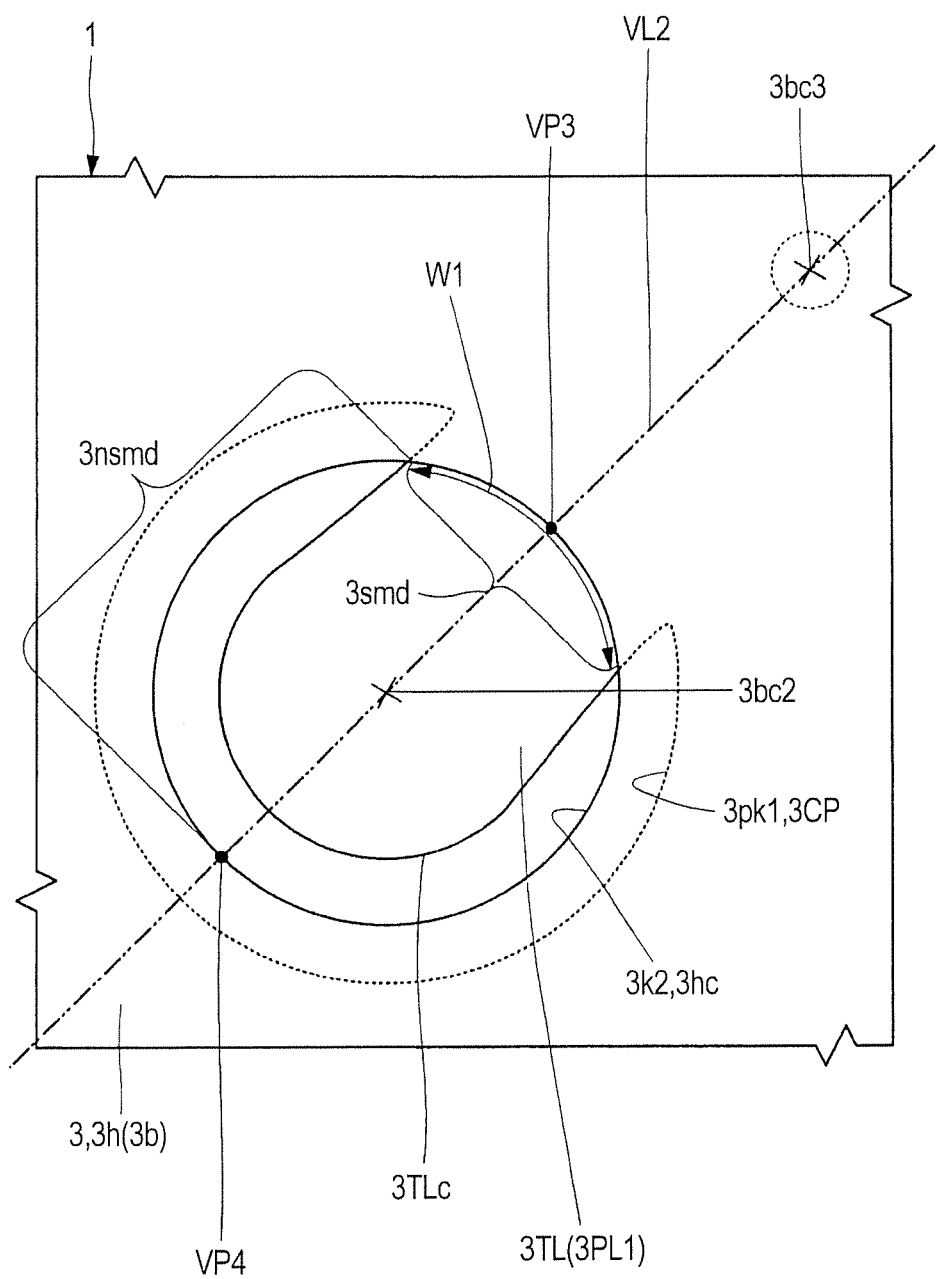
FIG. 22 is an enlarged plan view similar to FIG. 10 using the center of the lower surface of the wiring board shown in FIG. 8 as a reference.

That is, as shown in FIG. 22, the conductor pattern 3PL1 (the boundary between an exposed portion 3TL and a covered portion 3CP) is disposed at an intersection (virtual point) VP3 adjacent to the center 3bc3 of the lower surface 3b of the intersections between the virtual straight line VL2 and an aperture 3k2. A conductor aperture 3pk1 is disposed at an intersection (virtual point) VP4 distant from the center 3bc3 of the lower surface 3b of the intersections between the virtual straight line VL2 and the aperture 3k2. The virtual straight line VL2 shown in FIG. 22 is a straight line passing through the center 3bc3 of the lower surface 3b of the wiring board 3 and the center 3bc2 of the aperture 3k2.

As described above, it is believed that when temperature cyclic loading is applied, the solder balls 7 are broken due mainly to the difference in linear expansion coefficient between the semiconductor chip 2 and the mounting substrate 20 shown in FIG. 7. For this reason, if the center 3bc1 shown in FIG. 10 and the center 3bc3 shown in FIG. 22 are displaced from each other, it is preferred to determine the orientation of the exposed portions 3TL of the conductor pattern 3PL1 using the center 3bc1 of the region 3b1 shown in FIG. 10 as a reference.

However, it is difficult to make the linear expansion coefficients of the wiring board 3 and the mounting substrate 20 completely equal to each other. For this reason, stress occurs due to the difference in linear expansion coefficient between the wiring board 3 and the mounting substrate 20. Accordingly, as shown in FIG. 8, it is preferred to match the center 3bc3 of the lower surface 3b of the wiring board 3 and the center 3bc1 of the region 3b1 with each other.

In the above embodiment, the conductor pattern 3PL1 has been described as a conductor member forming the heat dissipation path; however, the conductor pattern 3PL1 may be used as an electrode terminal. For example, the conductor pattern 3PL1 may be used as a terminal for providing a reference potential or power supply potential to a circuit formed over the semiconductor chip 2. In this case, it is preferred to prevent or reduce breakage of the solder balls 7 connected with the conductor pattern 3PL1 to stably provide the reference potential or power supply potential to the semiconductor chip 2. By using the mode described in the above embodiment, it is possible to prevent or reduce breakage of the solder balls 7 connected with the conductor pattern 3PL1. As a result, it is possible to stably provide the reference potential or power supply potential to the semiconductor chip 2 to improve the reliability of the semiconductor device 1.

In the Preferred Mode section of the above embodiment, it has been stated that in order to make the heights of the solder balls 7 uniform, it is preferred to apply an NSMD structure to each of the lands 10. However, the region 3b1 of the lower surface 3b shown in FIG. 7 may be warped in such a manner that the region 3b1 protrudes toward the mounting substrate 20. In this case, if the heights of the solder balls 7 disposed in the region 3b1 is lower than the height of the solder balls 7 disposed in the peripheries of the lower surface 3b, it is possible to make the top heights (coplanarity) of the solder balls 7 uniform. Accordingly, if it is previously known that the wiring board 3 is warped as described above, it is preferred to apply an SMD structure to each of the lands 10 disposed in the peripheries.

While the various modifications have been described above, the modifications may be combined and used.

What is claimed is:
1. A semiconductor device, comprising:
(a) a wiring board including:
a first insulating layer including a first surface, and a second surface opposite to the first surface,
a first pattern formed on the second surface,
a plurality of second patterns formed on the second surface and also arranged around the first pattern in plan view, and
a second insulating layer formed over the second surface of the first insulating layer;
(b) a semiconductor chip mounted over the first surface of the first insulating layer, and also including:
a plurality of pads (PD) electrically connected with the plurality of second patterns, respectively,
wherein the second insulating layer has a plurality of first apertures and a plurality of second apertures,
wherein the plurality of first apertures expose a plurality of first parts of the first pattern and a plurality of first parts of the first insulating layer, respectively, and
wherein the plurality of second apertures expose the plurality of the second patterns and a plurality of second parts of the first insulating layer, respectively.
2. The semiconductor device according to claim 1,
wherein, in plan view, the first pattern has a first area overlapped with the semiconductor chip.
3. The semiconductor device according to claim 2,
wherein a plurality of first wirings are connected with the plurality of first parts of the first pattern, respectively, and wherein, in plan view, the plurality of first wirings are extended from the plurality of first parts of the first pattern toward a central portion of the wiring board, respectively.

4. The semiconductor device according to claim 3,
wherein a plurality of wirings are connected with the plurality of second patterns, respectively, and
wherein, in plan view, the plurality of second wirings are extended from the plurality of second patterns toward the central portion of the wiring board, respectively.

5. The semiconductor device according to claim 1,
wherein a plurality of first wirings are connected with the plurality of first parts of the first pattern, respectively, and
wherein, in plan view, the plurality of first wirings are extended from the plurality of first parts of the first pattern toward a central portion of the wiring board, respectively.

6. The semiconductor device according to claim 5,
wherein a plurality of wirings are connected with the plurality of second patterns, respectively, and
wherein, in plan view, the plurality of second wirings are extended from the plurality of second patterns toward the central portion of the wiring board, respectively.

7. The semiconductor device according to claim 1,
wherein a plurality of wirings are connected with the plurality of second patterns, respectively, and
wherein, in plan view, the plurality of second wirings are extended from the plurality of second patterns toward a central portion of the wiring board, respectively.

8. The semiconductor device according to claim 2,
wherein, in plan view, the plurality of first apertures are located between the plurality of first parts of the first pattern and a plurality of corner portions of the wiring board, respectively.

9. The semiconductor device according to claim 8,
wherein, in plan view, the plurality of second apertures are located between the plurality of the second patterns and the plurality of corner portions of the wiring board, respectively.

10. The semiconductor device according to claim 1,
wherein, in plan view, the plurality of first apertures are located between the plurality of first parts of the first pattern and a plurality of corner portions of the wiring board, respectively.

11. The semiconductor device according to claim 10,
wherein, in plan view, the plurality of second apertures are located between the plurality of the second patterns and the plurality of corner portions of the wiring board, respectively.

12. The semiconductor device according to claim 1,
wherein, in plan view, the plurality of second apertures are located between the plurality of the second patterns and a plurality of corner portions of the wiring board, respectively.

* * * * *